US010139236B2

(12) United States Patent
Hirai

(10) Patent No.: US 10,139,236 B2
(45) Date of Patent: Nov. 27, 2018

(54) ROUTE GENERATION PROGRAM, ROUTE GENERATION METHOD AND ROUTE GENERATION APPARATUS

(71) Applicant: CYBERWALKER INC., Aichi (JP)

(72) Inventor: Takayuki Hirai, Aichi (JP)

(73) Assignee: CYBERWALKER INC., Kasugai-Shi, Aichi (JP)

( * ) Notice: Subject to any disclaimer, the term of this patent is extended or adjusted under 35 U.S.C. 154(b) by 0 days.

(21) Appl. No.: 15/314,899

(22) PCT Filed: Jun. 29, 2016

(86) PCT No.: PCT/JP2016/069252
§ 371 (c)(1),
(2) Date: Nov. 29, 2016

(87) PCT Pub. No.: WO2017/029888
PCT Pub. Date: Feb. 23, 2017

(65) Prior Publication Data
US 2018/0149481 A1    May 31, 2018

(30) Foreign Application Priority Data

Aug. 20, 2015 (JP) .................................. 2015-163192

(51) Int. Cl.
*G06F 7/00* (2006.01)
*G06F 17/00* (2006.01)
(Continued)

(52) U.S. Cl.
CPC ..... *G01C 21/206* (2013.01); *G06F 17/30958* (2013.01); *G06F 17/50* (2013.01);
(Continued)

(58) Field of Classification Search
CPC . G01C 21/206; G01C 21/12; G06F 17/30958; G06F 17/5004; G06T 5/002; G06T 19/003
(Continued)

(56) References Cited

U.S. PATENT DOCUMENTS 8,346,474 B2    1/2013  Chen et al.
2010/0057354 A1*  3/2010  Chen ..................... G01C 21/20
                                                      701/533

FOREIGN PATENT DOCUMENTS

JP    10-228231 A    8/1998
JP    2006-048278 A    2/2006

OTHER PUBLICATIONS

International Search Report received in PCT Application No. PCT/JP2016/069252 dated Jun. 29, 2016, in 3 pages.
(Continued)

*Primary Examiner* — Mahmoud S Ismail
(74) *Attorney, Agent, or Firm* — Knobbe, Martens, Olson & Bear, LLP

(57) ABSTRACT

In a route generation method, a computer executes: a step of generating cells based on data about a floor plan that contains information indicating a type of a constituent element of a house and setting the information indicating the type of the constituent element in each of the cells; a step of reading the information indicating the type of the constituent element set in the cell, specifying an outer edge of a passable region based on whether the constituent element is passable, and generating data about a pathway in which the passable region is thinned, whether the constituent element is passable being determined in advance in association with the type of the constituent element; a step of generating a graph based on the data about the pathway; and a route search step of searching a path from the starting point to the ending point, using the graph.

9 Claims, 37 Drawing Sheets

(51) Int. Cl.
  G06F 19/00   (2018.01)
  G01C 21/20   (2006.01)
  G06F 17/50   (2006.01)
  G06T 19/00   (2011.01)
  G06F 17/30   (2006.01)
  G06T 5/00    (2006.01)
(52) U.S. Cl.
  CPC .......... *G06F 17/5004* (2013.01); *G06T 5/002* (2013.01); *G06T 19/00* (2013.01); *G06T 19/003* (2013.01)
(58) Field of Classification Search
  USPC .................................................. 701/433, 411
  See application file for complete search history.

(56) References Cited

OTHER PUBLICATIONS

International Preliminary Report on Patentability dated Mar. 1, 2018 for International Application No. PCT/JP2016/069252, 6 pages.

* cited by examiner

FIG.5

| IDENTIFICATION INFORMATION | ATTRIBUTE | ARRANGEMENT INFORMATION | | SIZE | PASSABLE OR IMPASSABLE |
|---|---|---|---|---|---|
| | | COORDINATES | ROTATION ANGLE | | |
| ... | ROOM | ... | ... | ... | PASSABLE |
| ... | WALL | ... | ... | ... | IMPASSABLE |
| ... | FITTING (WINDOW) | ... | ... | ... | IMPASSABLE |
| ... | FITTING (DOOR) | ... | ... | ... | PASSABLE |
| ... | STAIRS | ... | ... | ... | PASSABLE |
| ... | HOUSEHOLD EQUIPMENT (KITCHEN) | ... | ... | ... | IMPASSABLE |
| ... | HOUSEHOLD EQUIPMENT (TOILET) | ... | ... | ... | IMPASSABLE |
| ... | FURNITURE (SOFA) | ... | ... | ... | IMPASSABLE |
| ... | FURNITURE (TELEVISION STAND) | ... | ... | ... | IMPASSABLE |
| ... | PASSENGER CAR | ... | ... | ... | ... |

| |
|---|
| INDEX NUMBER |
| COORDINATES (X, Y) |
| ATTRIBUTE TYPE<br>(INTERIOR OF ROOM, FITTING, OPENING PART OR STAIRS) |
| IDENTIFICATION INFORMATION OF CONSTITUENT ELEMENT TO WHICH NODE BELONGS |
| THE NUMBER OF CONNECTED EDGES |
| INDEX NUMBERS OF CONNECTED EDGES |

FIG.18

| |
|---|
| INDEX NUMBER |
| INDEX NUMBERS OF NODES AT BOTH ENDS |
| IDENTIFICATION INFORMATION OF CONSTITUENT ELEMENT TO WHICH EDGE BELONGS |
| THE NUMBER OF APEXES BETWEEN NODES |
| APEX LIST (COORDINATE ARRAY) BETWEEN NODES |

FIG.21

| NODE INDEX | COORDINATES | | ATTRIBUTE TYPE | CONSTITUENT ELEMENT IDENTIFICATION INFORMATION | THE NUMBER OF CONNECTED EDGES | CONNECTED EDGE LIST | | | |
|---|---|---|---|---|---|---|---|---|---|
| | X | Y | | | | EDGE 1 | EDGE 2 | EDGE 3 | EDGE 4 |
| N1 | ... | ... | INTERIOR OF ROOM | ROOM 1 | 2 | a | b | - | - |
| N2 | ... | ... | INTERIOR OF ROOM | ROOM 1 | 2 | a | c | - | - |
| N3 | ... | ... | INTERIOR OF ROOM | ROOM 1 | 3 | b | d | f | - |
| N4 | ... | ... | FITTING | FITTING 2 | 3 | d | e | f | - |
| N5 | ... | ... | INTERIOR OF ROOM | ROOM 3 | 2 | c | e | - | - |
| ... | ... | ... | ... | ... | ... | ... | ... | ... | ... |
| N14 | ... | ... | INTERIOR OF ROOM | ROOM 4 | 1 | o | - | - | - |

FIG.22

| EDGE INDEX | BOTH-END NODES | | CONSTITUENT ELEMENT IDENTIFICATION INFORMATION | THE NUMBER OF VIA-APEXES | VIA-APEX LIST | | | | |
|---|---|---|---|---|---|---|---|---|---|
| | NODE 1 | NODE 2 | | | APEX 1 | APEX 2 | APEX 3 | APEX 4 | ... |
| a | 1 | 2 | ROOM 1 | 5 | ... | ... | ... | ... | ... |
| b | 1 | 3 | ROOM 1 | 8 | ... | ... | ... | ... | ... |
| c | 2 | 5 | ROOM 1 | 2 | ... | ... | ... | ... | ... |
| d | 3 | 4 | ROOM 1 | 3 | ... | ... | ... | ... | ... |
| ... | ... | ... | ... | ... | ... | ... | ... | ... | ... |
| p | 12 | 13 | ROOM 4 | 4 | ... | ... | ... | ... | ... |

FIG.23

| PATH IDENTIFICATION INFORMATION | THE NUMBER OF VIA-EDGES | VIA-EDGE LIST ||||||
| --- | --- | --- | --- | --- | --- | --- | --- |
| | | EDGE 1 | EDGE 2 | EDGE 3 | EDGE 4 | EDGE 5 | ... |
| 1 | 13 | a FORWARD | c FORWARD | e REVERSE | d REVERSE | f FORWARD | ... |
| ... | ... | ... | ... | ... | ... | ... | ... |
| 4 | 7 | a REVERSE | b FORWARD | d FORWARD | g FORWARD | i FORWARD | ... |
| 5 | 7 | a REVERSE | b FORWARD | f FORWARD | h FORWARD | i FORWARD | ... |
| 6 | 11 | a REVERSE | b FORWARD | f FORWARD | j FORWARD | m FORWARD | ... |

FIG31
CONTROL POINT m = p + l × f × $\vec{v}$
CONTROL POINT n = q + l × f × $\vec{w}$
(1) 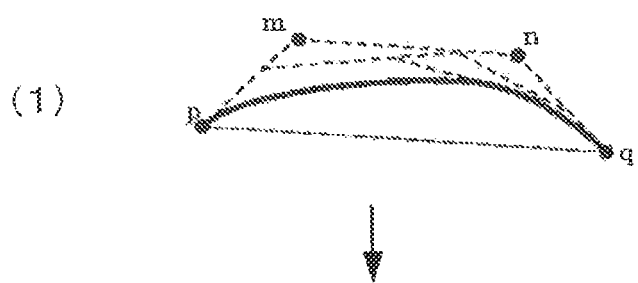
↓
CONTROL POINT m = p + l × f × adj × $\vec{v}$
CONTROL POINT n = q + l × f × adj × $\vec{w}$
(2) 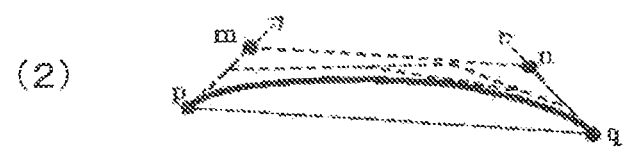

ROUTE GENERATION PROGRAM, ROUTE GENERATION METHOD AND ROUTE GENERATION APPARATUS

CROSS-REFERENCE TO RELATED APPLICATION

This application is a continuation application of International Application No. PCT/JP2016/69252, filed Jun. 29, 2016, which claims priority to Japanese Patent Application No. 2015-163192, filed Aug. 20, 2015. The contents of these applications are incorporated herein by reference in their entirety.

TECHNICAL FIELD

The present disclosure relates to a route generation program, a route generation method and a route generation apparatus.

BACKGROUND ART

For example, there is a technology of creating a three-dimensional model of a building and allowing for movement (walk-through) in the three-dimensional model. A user can move a camera (viewpoint), for example, by mouse operation. It is possible to simulate the movement in the building on a computer, which is useful for checking the usability of the building in a design phase or the like, for example.

Also, there has been proposed a technology of setting a traffic line in section link information indicating the connection relation of sections that constitute a floor plan (for example, Patent document 1). Pass-through sections and portals (gateways) on the way from the current position to a destination position are searched by tracing the connection relation of sections and portals alternately by referring to a portal connected with a section and further referring to a section connected to the portal. Then, the centers of the portals on the way from the current position to the destination position are sequentially joined by straight lines, and thereby, the traffic line is set.

Further, there has been proposed a technology of evaluating a spline curve such that pass points set on a two-dimensional image are joined and moving the viewpoint of the walk-through along the evaluated curve (for example, Patent document 2).

CITATION LIST

Patent Document

[Patent document 1] Japanese Patent Laid-Open No. 2006-48278
[Patent document 2] Japanese Patent Laid-Open No. 10-228231

SUMMARY

Problems to be Solved by the Disclosure

Conventionally, as for the walk-through function, there is a problem in that the user cannot perform the movement in the three-dimensional model as intended in the case of the user being not proficient in the operation. Further, when the movement route in the three-dimensional model is generated, not only it is unnatural to collide with an object such as a wall that is essentially impassable, but also the case of passing through the vicinity of a wall or the like on one side despite the existence of a wide space on the other side sometimes gives the user a feeling of strangeness.

The present disclosure has been made in view of the above problems, and has an object to generate a natural movement route that is less likely to give the user a feeling of strangeness, based on the information about the floor plan.

Means for Solving the Problems

In a route generation method according to some embodiments of the present invention, a computer executes: a cell division step of generating cells based on data about a floor plan that contains information indicating a type of a constituent element of a house and setting the information indicating the type of the constituent element in each of the cells, the cells being formed by separating a plane in a grid pattern having a predetermined size; a thinning step of reading the information indicating the type of the constituent element set in the cell, specifying an outer edge of a passable region based on whether the constituent element is passable, and generating data about a pathway in which the passable region is thinned, whether the constituent element is passable being determined in advance in association with the type of the constituent element; a graph generation step of generating a graph based on the data about the pathway generated in the thinning step, the graph containing nodes indicating an endpoint or an intersection point on the pathway and an edge connecting the nodes; and a route search step of setting a starting point and an ending point, based on an input from a user, and searching a path from the starting point to the ending point, using the graph generated in the graph generation step.

When the data about the pathway in which the passable region is thinned on the floor plan is generated, it is possible to generate the data about a pathway that is moderately distant from a peripheral object such as a wall, for example. That is, it is possible to generate a natural route that is less likely to give the user a feeling of strangeness, based on the information about the floor plan.

Further, the computer may further execute: a smoothing step of generating a movement route, based on the path obtained in the route search step, by transforming the path into a curve; a collision judgment step of reading the information indicating the type of the constituent element, for the movement route generated in the smoothing step, and judging whether the movement route and an impassable constituent element collide, based on whether the constituent element is passable, the information indicating the type of the constituent element being set in the cell through which the movement route passes, whether the constituent element is passable being determined in advance in association with the type of the constituent element; and a curve correction step of changing a curvature at a point on the movement route, when it is judged that the movement route and the impassable constituent element collide in the collision judgment step. Thereby, it is possible to generate a movement route in which the data about the pathway is transformed into a smooth curve. Further, since the movement route is corrected using the cell generated based on the data about the floor plan, a more natural movement route is obtained.

Further, the data about the floor plan may contain a constituent element the type of which is a door or stairs, and in the smoothing step, a polygonal line by which the path is approximated may be generated by adopting, as an apex, at least a node present at a position corresponding to a cell for the constituent element the type of which is the door or the stairs, and the movement route may be generated based on the apex of the polygonal line. Thereby, a pass-through point at the door or the stairs, which is the boundary with a room or the like on the floor plan, can be fixed, and the path for moving in room space can be transformed into the polygonal line after the approximation. Therefore, it is possible to generate a simplified smooth movement route while fixing the point for the movement.

Further, in the route search step, a via-point may be further set based on an input from the user, a second path may be further searched when each obtained first path does not pass through the via-point, and the path from the starting point to the ending point may be generated by linking the first path and the second path, the first path being a path from the starting point to the ending point, the second path being a path from the via-point to a node contained in the first path. Thereby, it is possible to generate a movement route that goes through various spots including a dead-end room.

Further, the computer may further execute a display step of drawing a three-dimensional model of a building indicated by the data about the floor plan, and orienting a sight line to a point on the movement route a predetermined distance away while moving a viewpoint along the movement route in the three-dimensional model. Thereby, it is possible to express a natural walk-through.

Further, in the route search step, when there is a node array that is looped in a predetermined distance or less, the route may be searched while the node array is replaced with a single virtual node. Thereby, it is possible to inhibit the search of a plurality of paths that have substantially no difference.

Further, the data about the floor plan may contain data about furniture that is an impassable constituent element, as the constituent element. Thereby, it is possible to generate the path and the movement route such that, for example, the furniture arranged by imagining life is avoided.

Here, the contents described in Means for solving the Problems can be combined in the range without departing from the problems and technical idea of the present disclosure. Further, the contents of Means for solving the Problems can be provided as a system including an apparatus such as a computer or a plurality of apparatuses, a method to be executed by the computer, or a program to be executed by the computer. Here, a recording medium holding the program may be provided.

Effects of the Disclosure

It is possible to generate a more natural movement route, based on a floor plan.

BRIEF DESCRIPTION OF THE DRAWINGS

FIG. 5 is a table illustrating an example of the data about the floor plan.

FIG. 9 is a diagram for describing the weighting of the cell.

FIG. 17 is a table illustrating an example of the data structure of a node that is held in a storage unit.

FIG. 18 is a table illustrating an example of the data structure of an edge that is held in the storage unit.

FIG. 21 is a table illustrating a specific example of the data about the node.

FIG. 22 is a table illustrating a specific example of the data about the edge.

FIG. 23 is a table illustrating a specific example of the data about a path.

FIG. 31 is a diagram for describing the change in curvature at a point on the Bezier curve.

MODE FOR CARRYING OUT THE DISCLOSURE

Hereinafter, modes for carrying out the present disclosure will be described with reference to the drawings. Here, the constitutions of embodiments are examples, and the present disclosure is not limited to the constitutions described in the embodiments.

<Functional Constitution>

Figure 1:
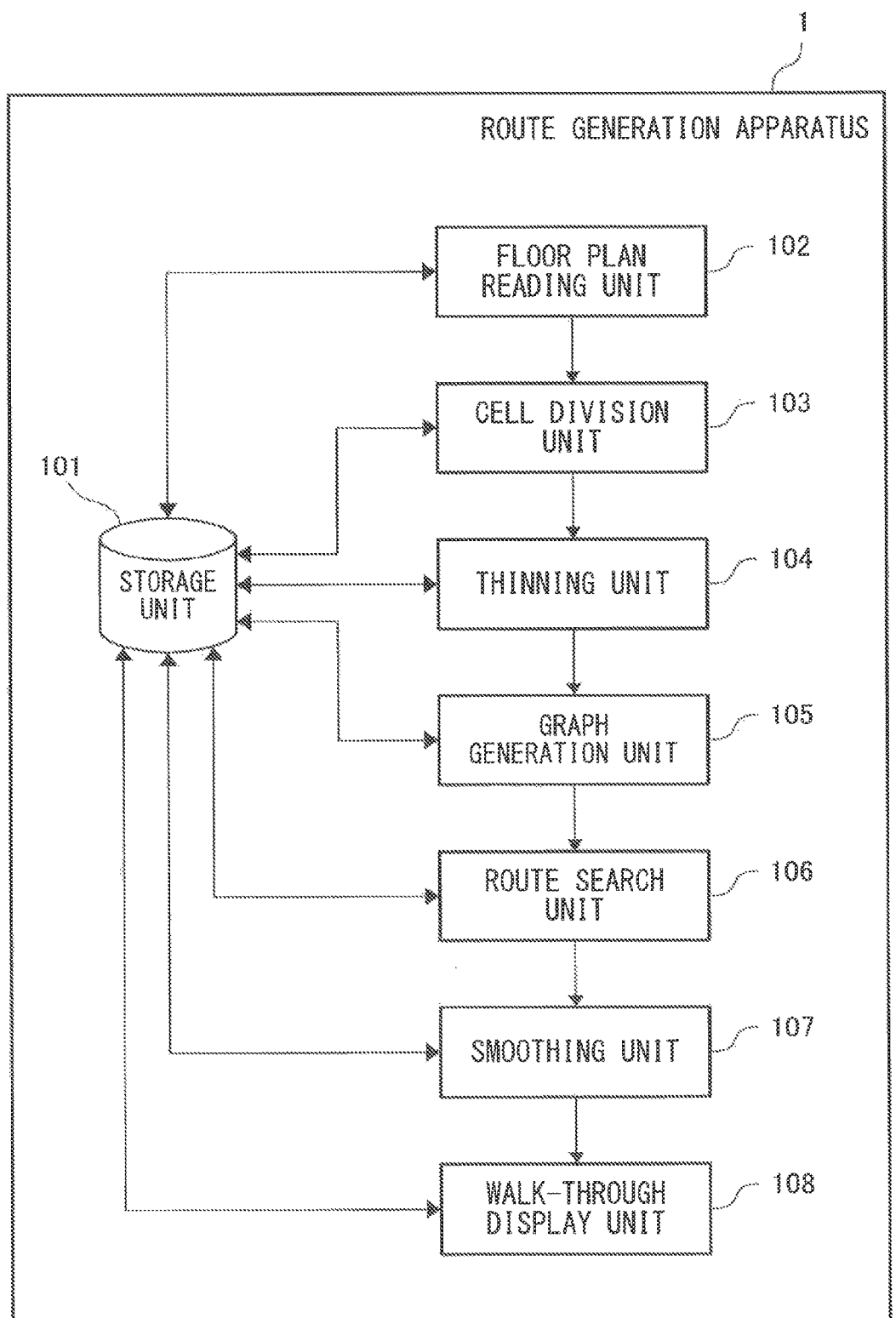
FIG. 1 is a functional block diagram illustrating an example of a route generation apparatus.

FIG. 1 is a functional block diagram illustrating an example of a route generation apparatus 1 according to an embodiment. The route generation apparatus 1 according to the embodiment includes a storage unit 101, a floor plan reading unit 102, a cell division unit 103, a thinning unit 104, a graph generation unit 105, a route search unit 106, a smoothing unit 107 and a walk-through display unit 108. The storage unit 101 stores the data about a floor plan that is created by predetermined software, and the data about a movement route or the like that is finally or intermediately generated by a process according to the embodiment. The floor plan reading unit 102 reads the data about the floor plan that is created in advance by the predetermined software. Here, the data about the floor plan according to the embodiment is the electronic data in which household equipment such as walls, windows and a kitchen, impassable constituent elements including obstacles such as furniture, and passable constituent elements such as room space, passageways, doors, stairs and a garden are arranged on a plane. The cell division unit 103 generates grid-pattern cells holding predetermined attribute information, based on the read data about the floor plan. The thinning unit 104 generates the data about a pathway in which a passable region is thinned, based on the distance from the contour of the passable region, using a Hilditch algorithm, for example. The graph generation unit 105 transforms the data about the pathway, into a graph expressed by nodes (apexes) that are endpoints or diverging points and edges (branches) that connect the nodes. The route search unit 106 searches a path (way) that is expressed by an edge array or node array joining two apexes, using the coordinate data of a starting point, an ending point and a relay point that are designated by a user, for example. The smoothing unit 107 smooths the path and generates a movement route. Further, the walk-through display unit 108 displays the manner of moving along the movement route generated in a three-dimensional model, on a monitor or the like.

<Apparatus Constitution>

Figure 2:
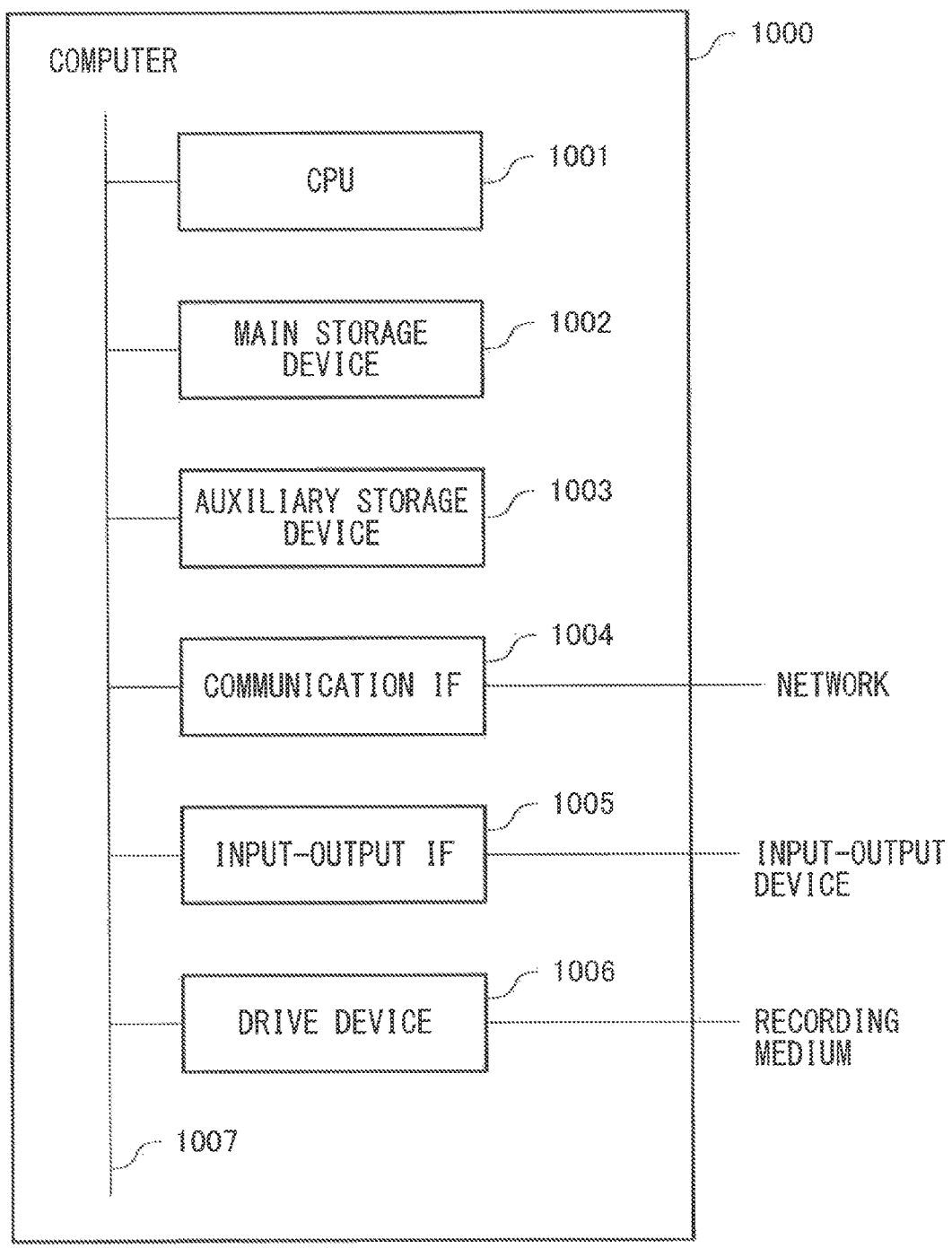
FIG. 2 is an apparatus constitution diagram illustrating an example of a computer.

Here, the route generation apparatus 1 is a computer illustrated in FIG. 2. FIG. 2 is an apparatus constitution diagram illustrating an example of the computer. For example, the computer includes a CPU (Central Processing Unit) 1001, a main storage device 1002, an auxiliary storage device 1003, a communication IF (Interface) 1004, an input-output IF (Interface) 1005, a drive device 1006 and a communication bus 1007. The CPU 1001 performs a process described in the embodiment, by executing a program. The main storage device 1002 caches the program and data read by the CPU 1001, and expands the workspace for the CPU. Specifically, the main storage device is a RAM (Random Access Memory), a ROM (Read Only Memory) or the like. The auxiliary storage device 1003 stores the program to be executed by the CPU 1001, the setting information to be used in the embodiment, and the like. Specifically, the auxiliary storage device 1003 is a HDD (Hard-disk Drive), a SSD (Solid State Drive), a flash memory or the like. The main storage device 1002 and the auxiliary storage device 1003 work as the storage unit 101 illustrated in FIG. 1. The communication IF 1004 sends and receives data with another computer apparatus. Specifically, the communication IF 1004 is a wired or wireless network card or the like. The input-output IF 1005, which is connected with input-output devices, receives the input from the user and outputs information to the user. Specifically, the input-output device is an image input device such as a camera, a keyboard, a mouse, a display, a sensor such as a GPS receiver, a touch panel, or the like. The drive device 1006 reads the data recorded in a storage medium such as a flexible disk and an optical disk, and writes data in the storage medium. The above constituent elements are connected with the communication bus 1007. Here, it is allowed to provide the constituent elements in plurality, and it is allowed not to provide some constituent elements (for example, the drive device 1006). Further, the input-output device may be formed integrally with the computer. Further, the program to be executed in the embodiment may be provided through a removable storage medium that is readable by the drive device, an auxiliary storage device such as a USB memory, a network IF, or the like. Then, when the CPU 1001 executes the program, the above computer serves as the route generation apparatus 1. In the embodiment, the description will be made assuming that a single computer performs the processing in a stand-alone manner, but it is allowed to adopt a constitution in which a part or a whole of the function is provided by another computer connected through a network such as the internet or an intranet and the processing result is sent to a user's terminal.

<Route Generation Process>

Figure 3:
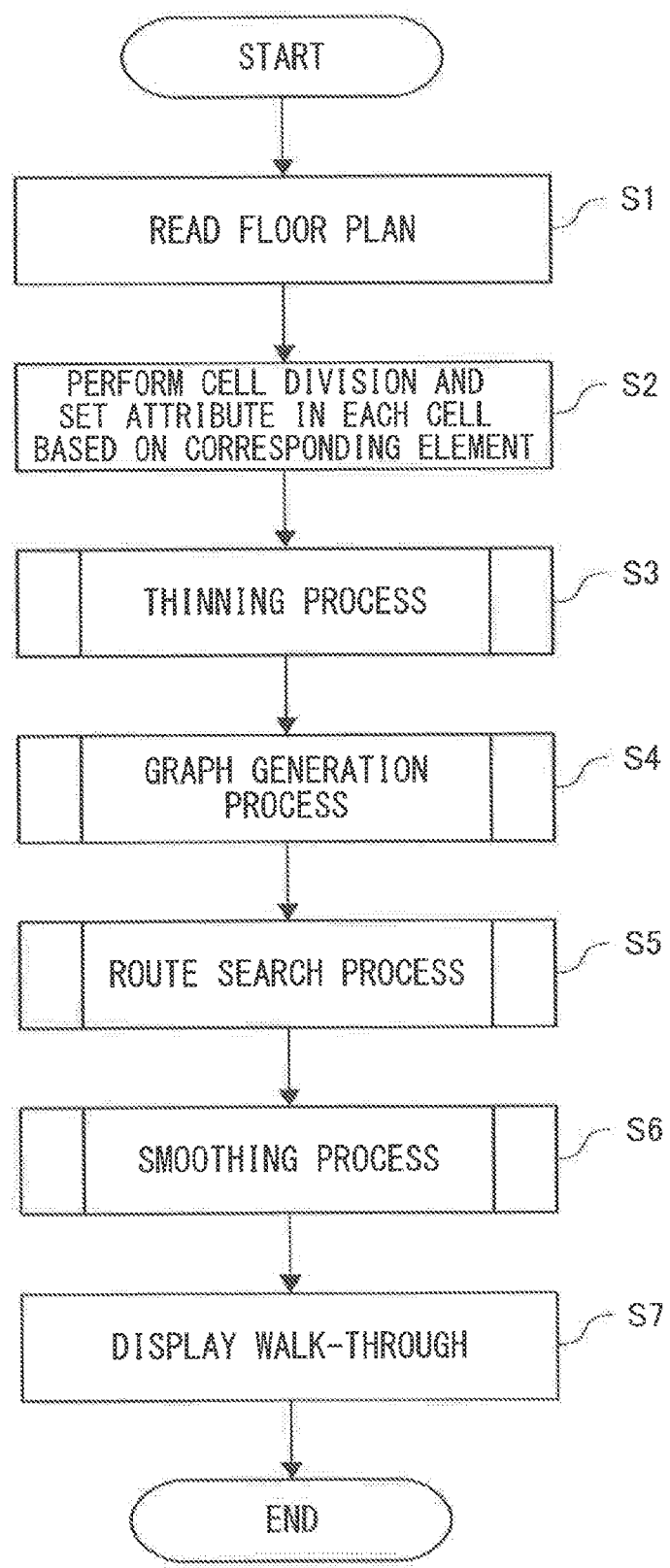
FIG. 3 is a process flow diagram illustrating an example of a route generation process.

FIG. 3 is a process flow diagram illustrating an example of a route generation process. The floor plan reading unit 102 of the route generation apparatus 1 reads the data about the floor plan stored in the storage unit 101, in response to the operation by the user (FIG. 3: S1).

Figure 4:
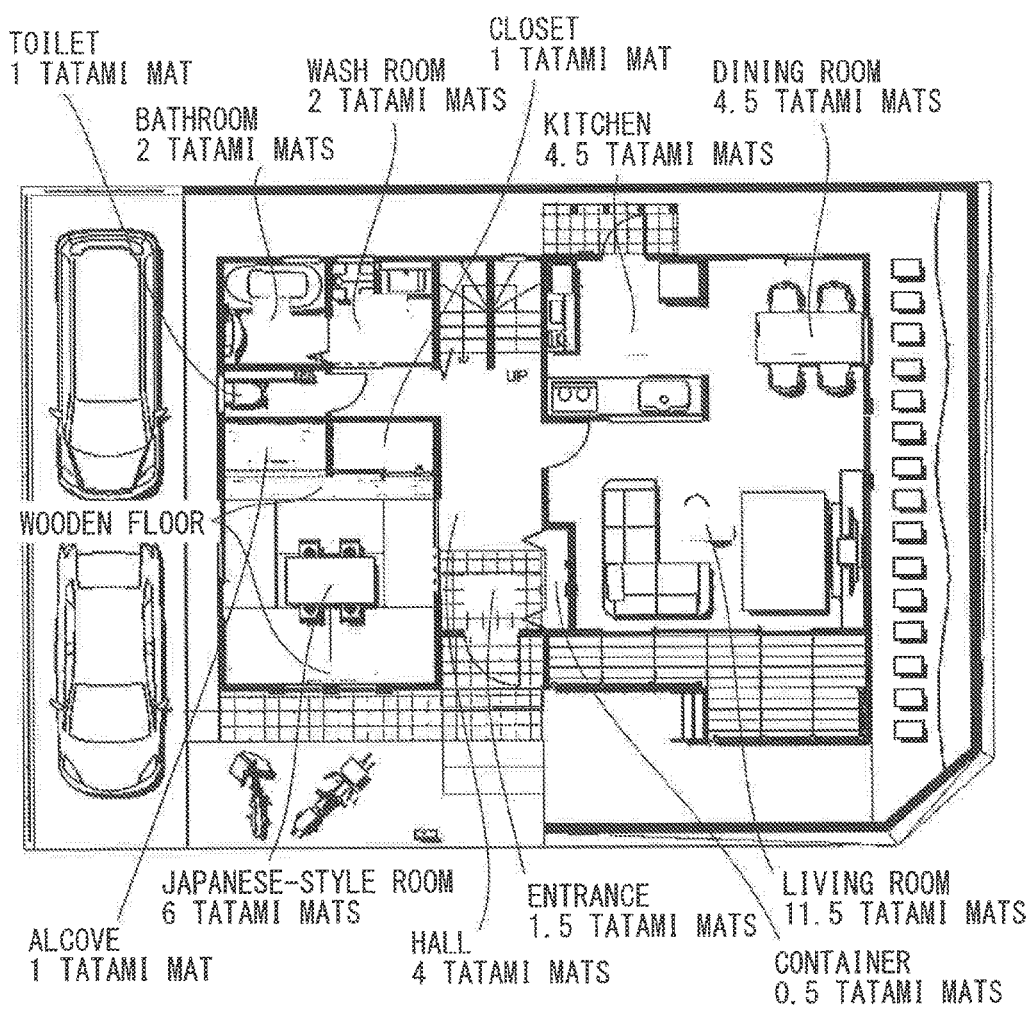
FIG. 4 is a diagram illustrating a display example of a floor plan.

FIG. 4 is a diagram illustrating a display example of the floor plan in which constituent elements of a house are placed on a plane. Further, FIG. 5 is a table illustrating an example of the data about the floor plan stored in the storage unit. The data about the floor plan contains constituent elements indicating boundaries of regions such as a wall, a window and a door, constituent elements indicating regions such as a room, a passageway, stairs and a garden, and constituent elements indicating household equipment or furniture. Further, each constituent element contains the information of the position, the size, the attribute representing the object indicated by the constituent element (the type of the object indicated by the constituent element), the identification information for uniquely specifying the constituent element, and the like.

The floor plan in FIG. 4 expresses the design data about the house on a plane. The data about the floor plan holds the information of not only the width and depth but also the height, in association with the attribute of the size illustrated in FIG. 5. Then, the data about the floor plan is used also for generating a three-dimensional model related to the floor plan. Here, the constituent element is classified into an impassable constituent element in the three-dimensional model including household equipment such as a wall, a window and a kitchen, and an obstacle such as furniture, and a passable constituent element such as a room space, a passageway, a door, stairs and a garden. Whether the constituent element is passable is determined depending on the type of the object indicated by the constituent element, but as illustrated in FIG. 5, the information indicating whether the constituent element is passable may be stored as the data about the floor plan.

After S1, the cell division unit 103 of the route generation apparatus 1 stores the attribute information of the constituent elements of the floor plan illustrated in FIG. 4, in a plurality of cells that are generated by dividing the plane in a grid pattern having a predetermined size (FIG. 3: S2). The cell according to the embodiment means each of the regions into which the plane is divided at a predetermined interval lengthwise and breadthwise, for example. Here, the size of a side of the cell can be determined depending on the size of an object space expressed on the floor plan. In the embodiment, a space through which a human can pass is searched in a later process. It is only necessary to extract a movement route having a width of about 40 to 50 cm, and therefore, the plane is divided into 10 cm square cells, for example.

Figures 6, 7:
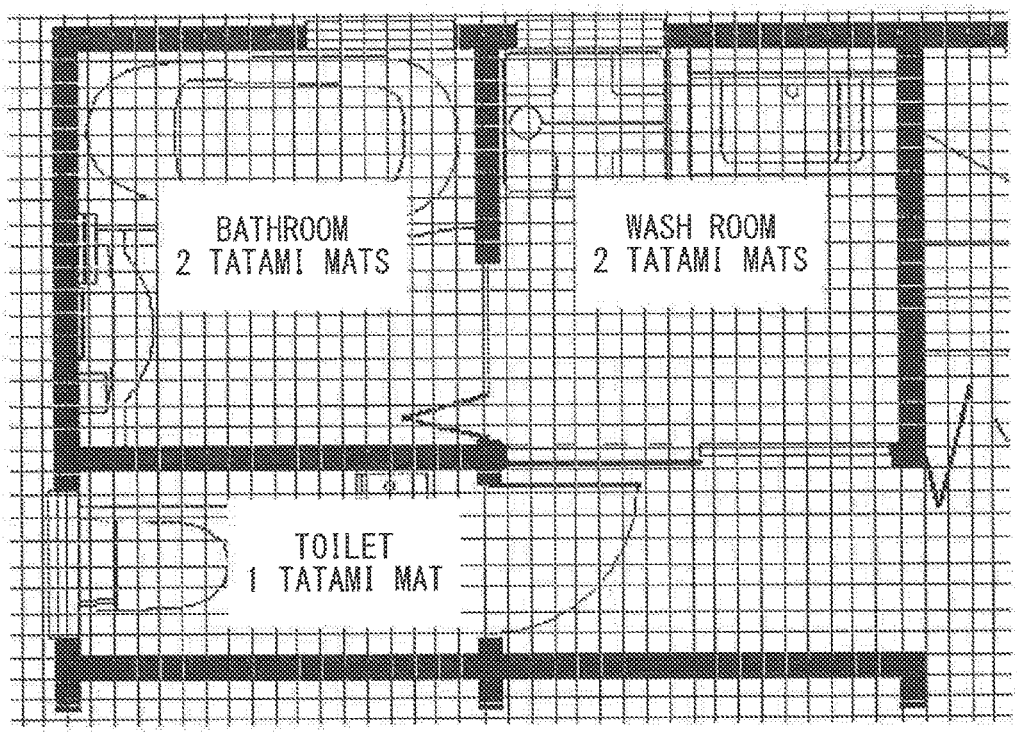
FIG. 6 is a diagram for describing the floor plan divided into cells.
FIG. 7 is a diagram illustrating an example of the attribute information that is held in the cell.

FIG. 6 is an example of an image illustrating a state in which a part of the floor plan illustrated in FIG. 4 is divided into 10 cm×10 cm cells. Further, FIG. 7 is a diagram illustrating an example of the attribute information that is held in each of the cells of the floor plan divided into the cells. In the embodiment, the information indicating the type of the constituent element is held as the attribute information. Here, the attribute information of the cell in the embodiment, for example, is held as a 24-bit color value (RGB (Red, Green, Blue) components) indicating the color component of each pixel, such that each cell corresponds to one pixel of raster data. Further, the value corresponding to the type of the constituent element of the floor plan is expressed as a numerical value, and the process of holding the value in the cell can be performed by assigning the value, for example, to the R component, when the constituent element of the floor plan is drawn as raster data on a scale in which one pixel is 10 cm×10 cm.

In the example of FIG. 7, "0" is assigned to walls in the floor plan, "2" is assigned to obstacles such as furniture, "5" is assigned to fittings such as doors, "6" is assigned to opening parts of walls, "7" is assigned to stairs, "8" is assigned to the interiors of rooms, and "9" is assigned to spaces outside the house. Here, it is determined in advance that 0 and 2 indicate parts through which a human cannot go and 5, 6, 7, 8 and 9 indicate parts through which a human can go.

Further, in the embodiment, the identification number of the constituent element for identifying an identical room or fitting at the part through which a human can pass is held using the G and B components of each pixel. As the identification number of the constituent element, for example, a serial number or the like is put, based on the identification information illustrated in FIG. 5. Further, in the G and B components, for example, when the value of the B component becomes 256, the carry-over is performed to the G component that is the second digit, and the whole of the G and B components represents a single piece of identification information. That is, the value of the G component is the quotient resulting from dividing the identifi- cation number by a divisor "256", and the value of the B component is the remainder resulting from dividing the identification number by 256. Therefore, for example, a cell indicating a room whose identification number is 2548 (=256×9 (G)+244 (B)) is expressed in a color in which the respective components of RGB are (8, 9, 244). Here, in the embodiment, the image that is divided into the cells and that holds the attribute information as the color value is referred to as a route search image.

Figure 8:
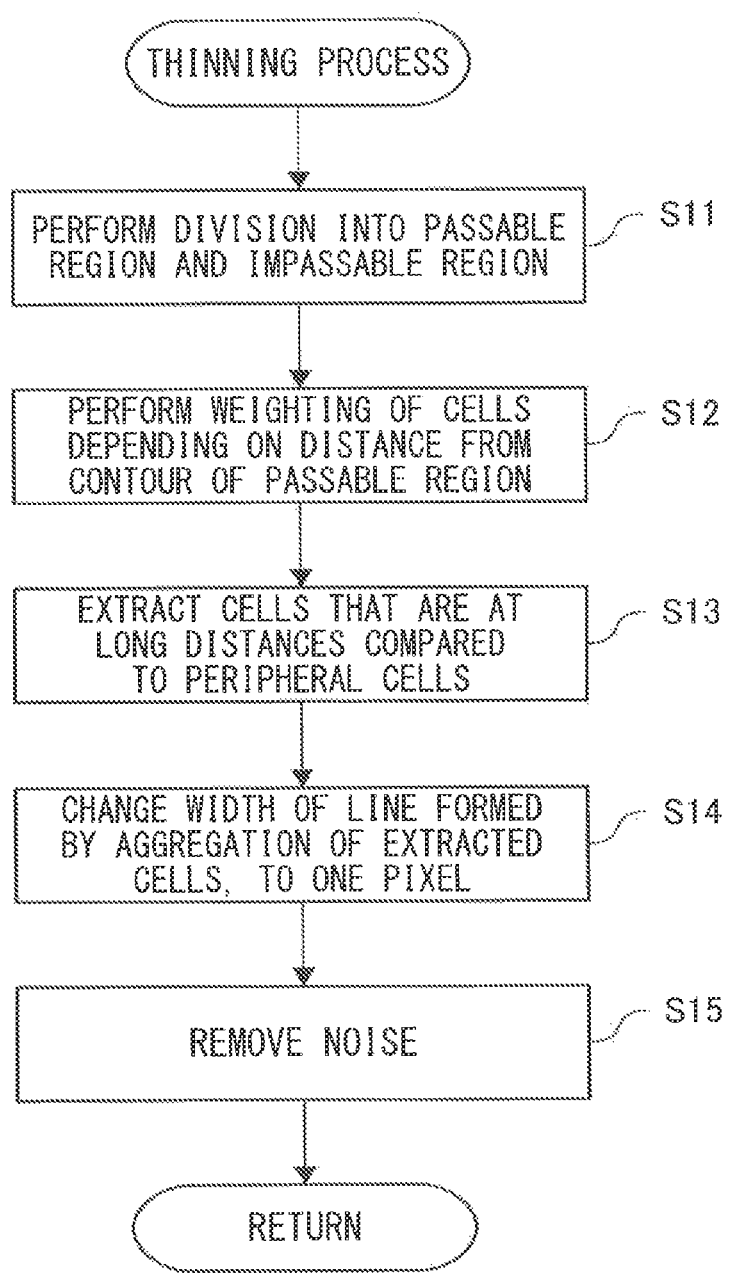
FIG. 8 is a process flow illustrating an example of a thinning process.

After S2, the thinning unit 104 of the route generation apparatus 1 performs a thinning process (S3). The thinning unit 104 thins a passable region, which is an aggregation of passable cells. FIG. 8 is a process flow illustrating an example of the thinning process. First, the thinning unit 104 classifies the cells into passable cells and impassable cells, based on the R component illustrated in FIG. 7 (FIG. 8: S11). Specifically, cells in which the R component illustrated in FIG. 7 is 2 or less are impassable cells. Therefore, for example, a map having cells corresponding to the route search image and is prepared, and all impassable cells on the map are transformed into "0". Further, cells in which the R component illustrated in FIG. 7 is 5 or more are passable cells, and therefore, for example, all are transformed into an initial value "−1".

Next, the thinning unit 104 performs the weighting of the cell, depending on the distance from the impassable part (that is, the outer edge of the passable region) (S12). Here, the standard value indicating the distance from the impassable cell is referred to as MaxWeight, and the initial value is "0". In the step, the map on which 0 and −1 are set in S11 is scanned, and the values of cells (passable cells) in each of which the value is −1 and the above, under, right and left cells (referred to as four near cells also) have the same value as MaxWeight are updated to MaxWeight+1. After all cells are scanned, MaxWeight is increased (incremented) by 1, and until the cells having a value of −1 are eliminated, the scan is repeated for the cells having −1.

Figure 9:
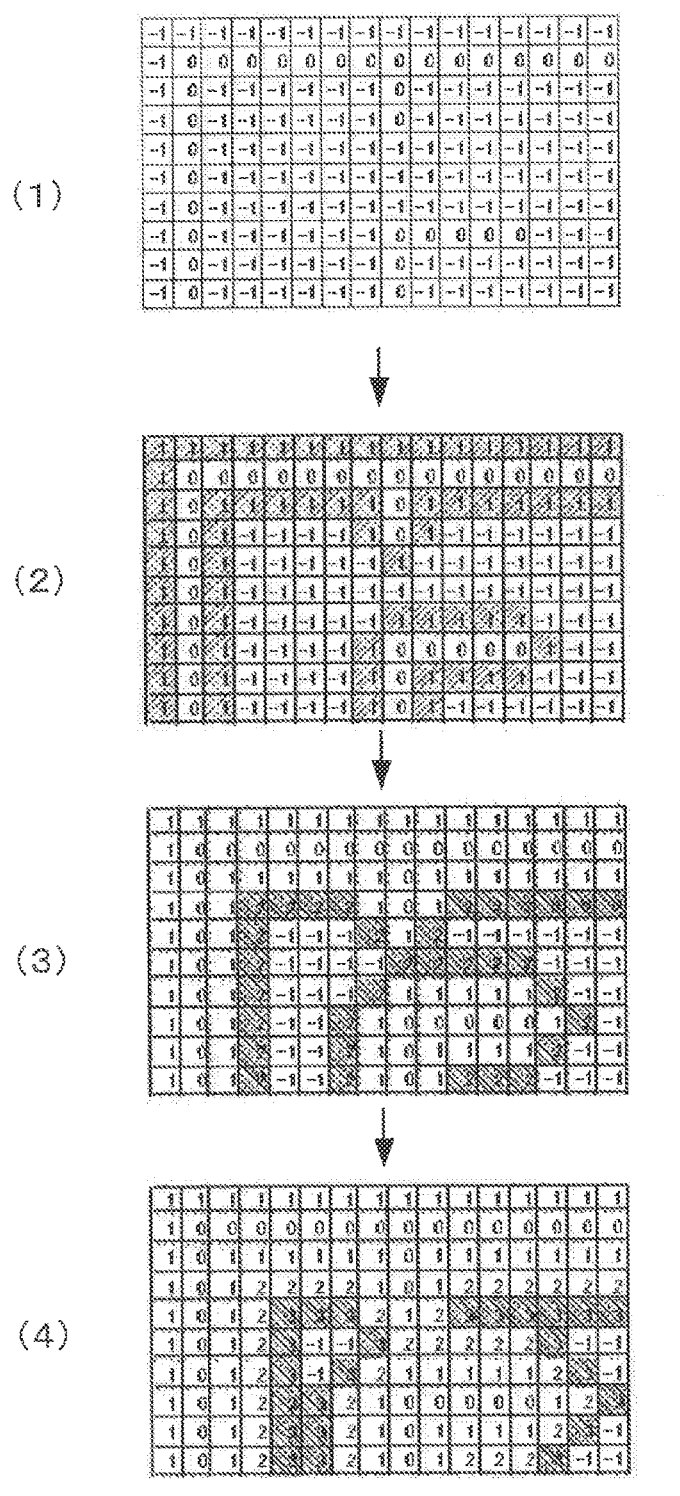

FIG. 9 illustrates a specific example of the values of the cells that are updated by the process of S12. First, as illustrated in the top stage (1), 0 indicating the impassable cell or −1 indicating the passable cell is set based on the value of the R component illustrated in FIG. 7. Further, as illustrated by the shaded cells in the second stage (2), the values of cells that are of the cells having −1 and that are adjacent to the cells having MaxWeight "0" are transformed into "1", which is MaxWeight+1. Then, the value of MaxWeight is updated to MaxWeight+1, and as illustrated by the shaded cells in the third stage (3), the values of cells that are of the cells having −1 and that are adjacent to the cells having MaxWeight "1" are transformed into "2", which is MaxWeight+1. Thereafter, the value of MaxWeight is updated to MaxWeight+1, and as illustrated by the shaded cells in the fourth stage (4), the values of cells that are of the cells having −1 and that are adjacent to the cells having MaxWeight "2" are transformed into "3", which is MaxWeight+1. By repeating such a process, the weighting of the cells in the passable region is performed based on the distance from the outer edge of the passable region.

Next, the thinning unit 104 extracts cells that are at long distances from the outer edge of the passable region compared to the peripheral cells (S13). In the step, the processing result is recorded on a map (referred to as an extraction map) that is different from that in S12 and in which 0 is stored in the impassable cell and −1 is stored in the passable cell as the initial values. First, for each cell in which the value on the extraction map is −1, a predetermined value is evaluated using the values of the eight peripheral cells (eight near cells) on the map weighted in S12.

Figures 10, 11:
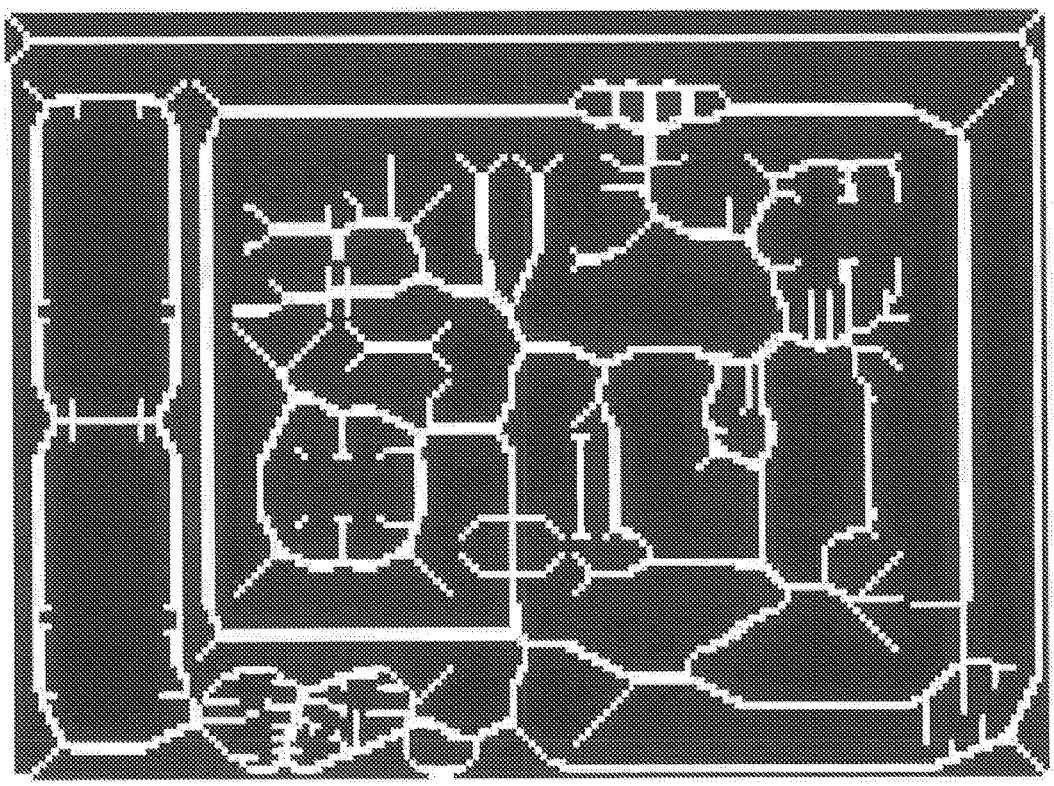
FIG. 10 is a diagram for describing a process-object cell and eight near cells around the cell.
FIG. 11 is a diagram for describing the extraction of cells that are at long distances from an outer edge of a passable region.

FIG. 10 is a diagram for describing a process-object cell and the eight near cells around the cell. FIG. 10 illustrates nine cells of 3×3. Reference characters A, B and C are put on the left column in descending order, reference characters D, E and F are put on the central column in descending order, and reference characters G, H and I are put on the right column in descending order. When the central cell E is the process-object cell, in the step, the following values sum1 to sum4 are evaluated using the values on the map weighted in S12.

$$sum1=(D-A)+(D-G)+(E-B)+(E-H)+(F-C)+(F-I)$$

$$sum2=(B-A)+(B-C)+(E-D)+(E-F)+(H-G)+(H-I)$$

$$sum3=(E-A)+(E-B)+(E-D)+(E-F)+(E-H)+(E-I)$$

$$sum4=(E-B)+(E-C)+(E-F)+(E-D)+(E-G)+(E-H)$$

Thereafter, in the step, when the maximum value of sum1 to sum4 is more than 0, the maximum value is held in the process-object cell E on the extraction map. On the other hand, when the maximum value of sum1 to sum4 is 0 or less, 0 is held in the cell E on the extraction map. By such a process, it is possible to keep a cell in which the value of the weight set in S12 is large in the peripheral cells, and to set the values of the peripheral cells to 0. FIG. 11 illustrates a schematic example of the floor plan after the process of S13 is performed for the whole of the floor plan illustrated in FIG. 4. In FIG. 11, cells in each of which the weight value is larger compared to the peripheral cells are extracted in white.

Further, the thinning unit 104 thins the width of a line formed by the extracted cells, to one pixel, based on a predetermined rule (S14). Here, for the thinning process, various existing techniques such as the Hilditch algorithm can be used. For example, in the step, each cell is scanned using the extraction map after the process of S13. First, cells that are of the eight near cells around the process-object cell and in which values more than 0 are held are counted. That is, when E of the cells illustrated in FIG. 10 is the process object, the number of cells that are of A to D and F to I and that have values more than 0 is counted up.

Further, the number of applicable patterns of the following patterns (1) to (12) is counted, and the total value is held in association with the process-object cell. The patterns (1) to (12) are expressed by the values of three adjacent cells of the eight near cells around the process-object cell. Here, the following patterns (1) to (12) are also described using the reference characters of the nine cells illustrated in FIG. 10.

(1) D=a value of 1 or more, G=0, H=a value of 1 or more, and the values of A to C, F and I do not matter (2) D=a value of 1 or more, G=a value of 1 or more, H=0, and the values of A to C, F and I do not matter (3) D=a value of 1 or more, G=0, H=0, and the values of A to C, F and I do not matter (4) F=a value of 1 or more, H=a value of 1 or more, I=0, and the values of A to D and G do not matter (5) F=0, H=a value of 1 or more, I=a value of 1 or more, and the values of A to D and G do not matter (6) F=0, H=a value of 1 or more, I=0, and the values of A to D and G do not matter (7) B=a value of 1 or more, C=0, F=a value of 1 or more, and the values of A, D and G to I do not matter (8) B=0, C=a value of 1 or more, F=a value of 1 or more, and the values of A, D and G to I do not matter (9) B=0, C=0, F=a value of 1 or more, and the values of A, D and G to I do not matter

(10) A=0, B=a value of 1 or more, D=a value of 1 or more, and the values of C and F to I do not matter

(11) A=a value of 1 or more, B=a value of 1 or more, D=0, and the values of C and F to I do not matter

Figure 12:
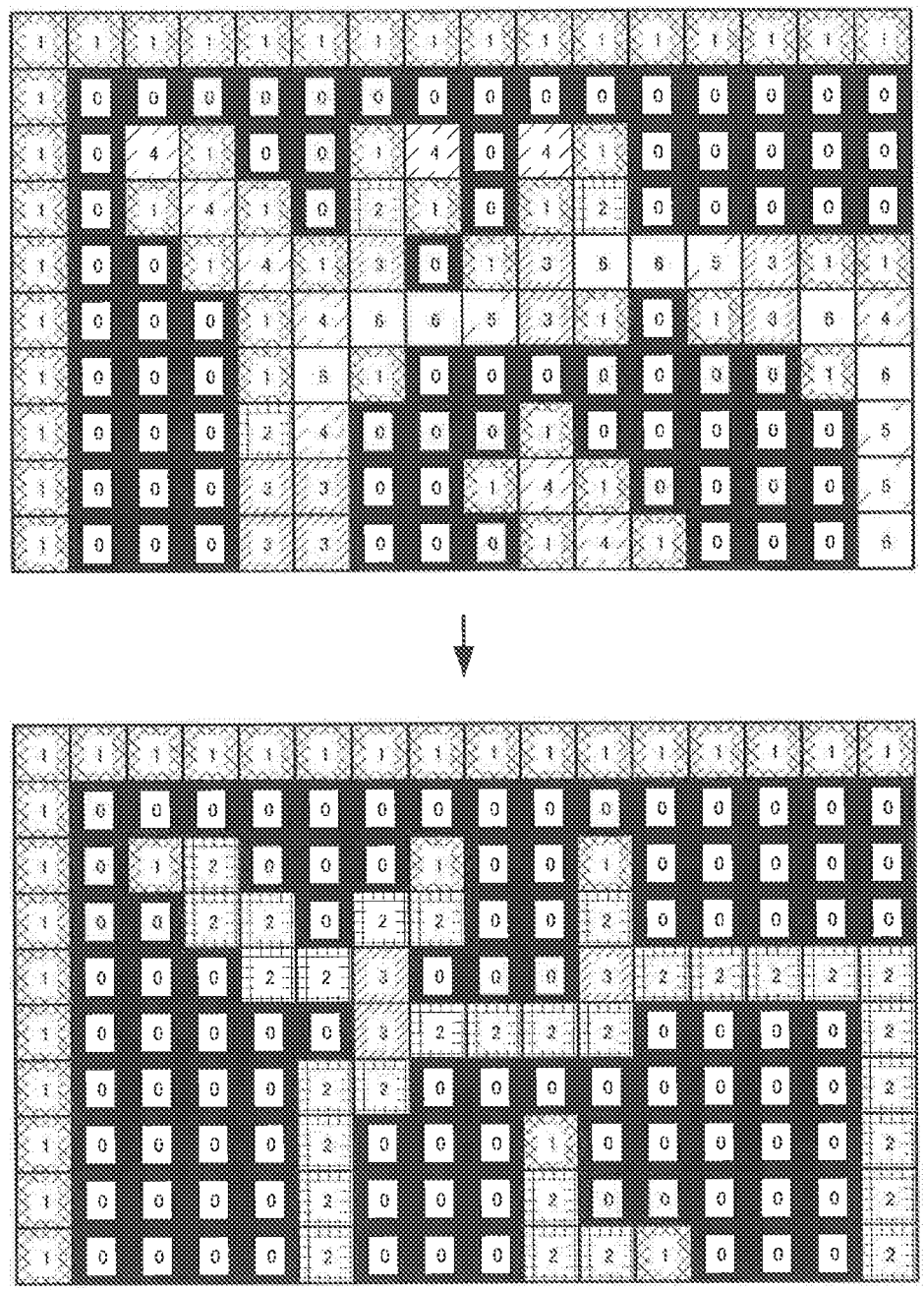
FIG. 12 is a diagram for describing a specific example of thinning.
Figure 13:
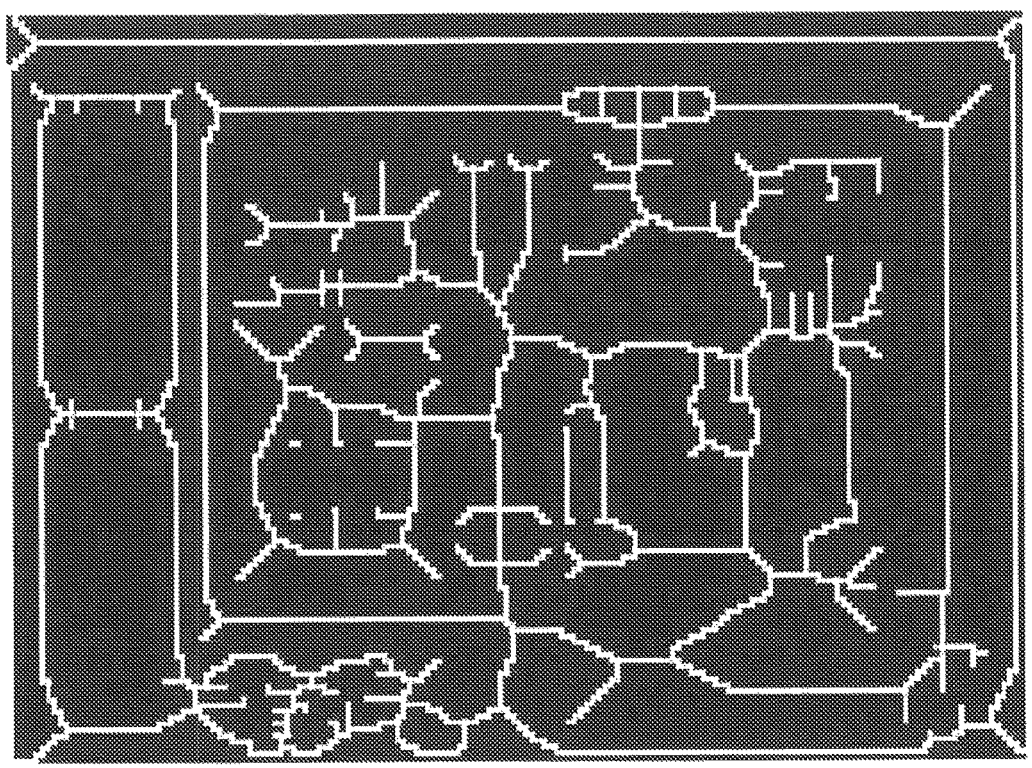
FIG. 13 is a diagram illustrating an example of a pathway after the thinning.

(12) A=0, B=a value of 1 or more, D=0, and the values of C and F to I do not matter Then, in the case where the total value initially evaluated in S14 is 3 or more and where the number of the applicable patterns of the above patterns (1) to (12) is 1, the value of the process-object cell is set to 0. Such a process is performed for each of the cells extracted in S13, and thereby, the width of the passable region on the extraction map becomes one pixel. In the embodiment, the region in which the width is one pixel is used as a candidate of the user pathway on the floor plan. FIG. 12 is a partial enlarged diagram illustrating examples before and after the white region illustrated in FIG. 11 is thinned by the process of S14. Here, the value held in the cell on the extraction map after the process of S14 indicates an endpoint of the candidate of the pathway in the case of 1, indicates a point on the way of the candidate of the pathway in the case of 2, and indicates a point diverging in three directions or four directions in the case of 3 or 4. Further, FIG. 13 is a diagram illustrating an example in which the extraction region illustrated in FIG. 11 is thinned by the process of S14. The extraction map after the process of S14 is referred to as a thinned map. The thinned map holds the value illustrated in FIG. 12, in each of the cells contained in the candidate of the pathway.

Thereafter, the thinning unit 104 performs a process of removing noise from the candidates of the pathway on the thinned map (S15). As illustrated in FIG. 13, in the process of S14, many whisker-like short lines appear on the candidates of the pathway. In the step, these dead-end short pathway candidates are eliminated.

Specifically, first, cells in each of which the value contained in the thinned map is 1 are extracted, and the value is replaced with 0 for all cells. Subsequently, cells in each of which the value contained in the thinned map is 2 are extracted. When the number of cells that are of the eight near cells around the cell and that have a value of 1 or more is 1, the value of this cell is changed into 1 (a new endpoint is set). Further, in the case where two or more cells having values other than 0 are present in the eight near cells around the cell in which the value in the thinned map is 2 and where the cells that are of the eight near cells and that have values other than 0 are not adjacent to each other, the value of the cell is kept to 2. Further, in the case where two or more cells having values other than 0 are present in the eight near cells around the cell in which the value in the thinned map is 2 and where the cells that are of the eight near cells and that have values other than 0 are all adjacent to each other, the value of the cell is replaced with 0. Then, after the cells having a value of 2 are all processed, the above-described process of replacing all the cells having a value of 1 with 0 is performed again, and the processes are repeated until the cells having a value of 1 are eliminated.

Further, in the case where there is an isolated region having a Y-shape or a cross shape, a one-pixel cell is left. Therefore, finally, a cell around which all the eight near cells have 0 is extracted, and the value is replaced with 0.

Figure 14:
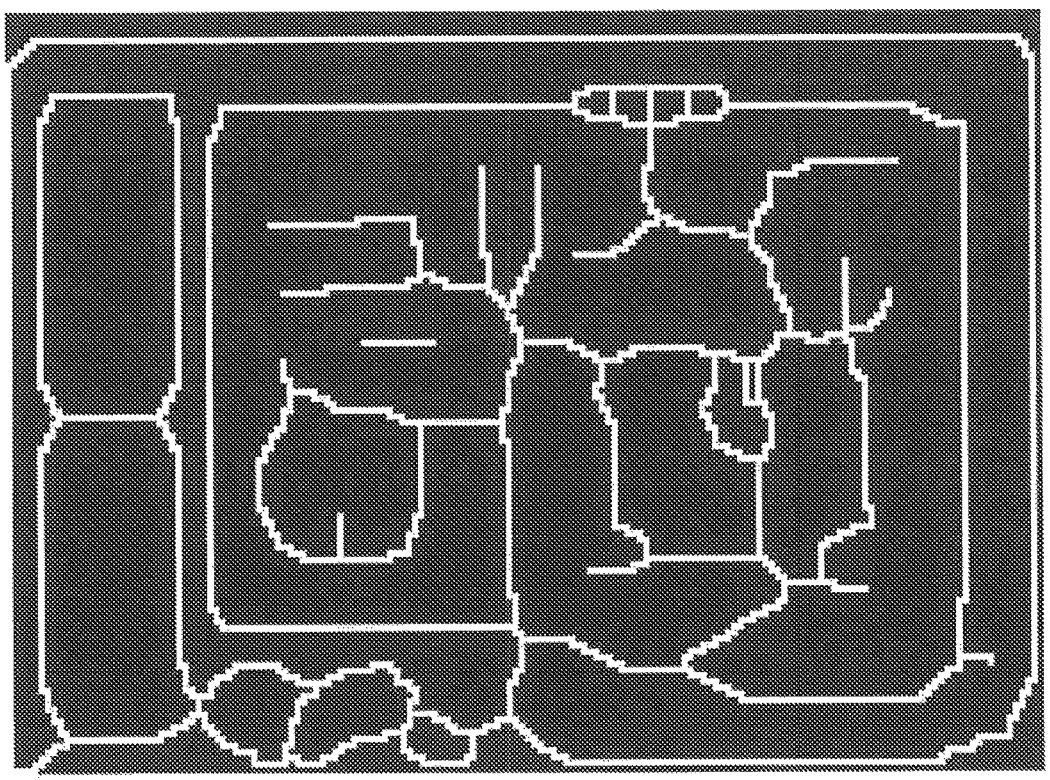
FIG. 14 is a diagram illustrating an example of candidates of a pathway after noise removal.

By such a process, a pathway illustrated in FIG. 14 is generated. Here, the image in FIG. 14 illustrating the pathway generated by the thinning process is referred to a route candidate map. Thereafter, the process flow returns to the process in FIG. 3.

Figure 15:
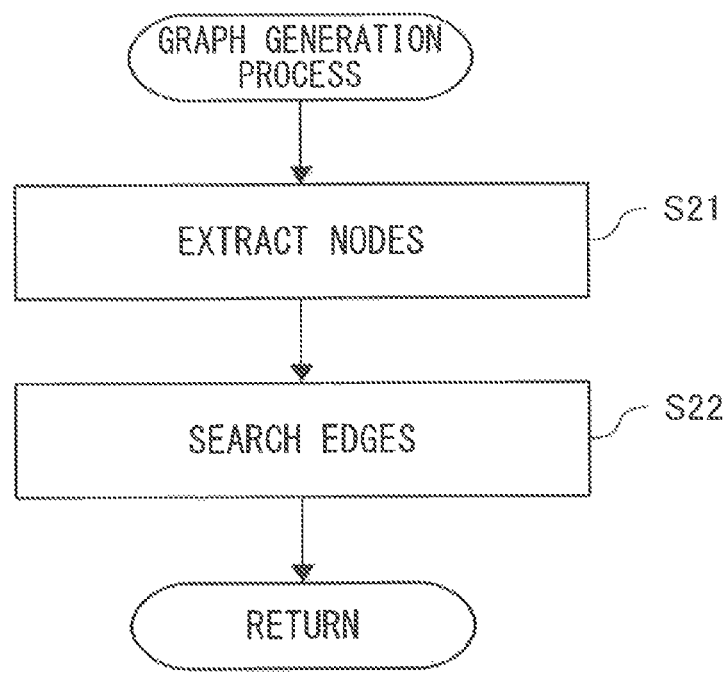
FIG. 15 is a process flow illustrating an example of a graph generation process.
Figure 16:
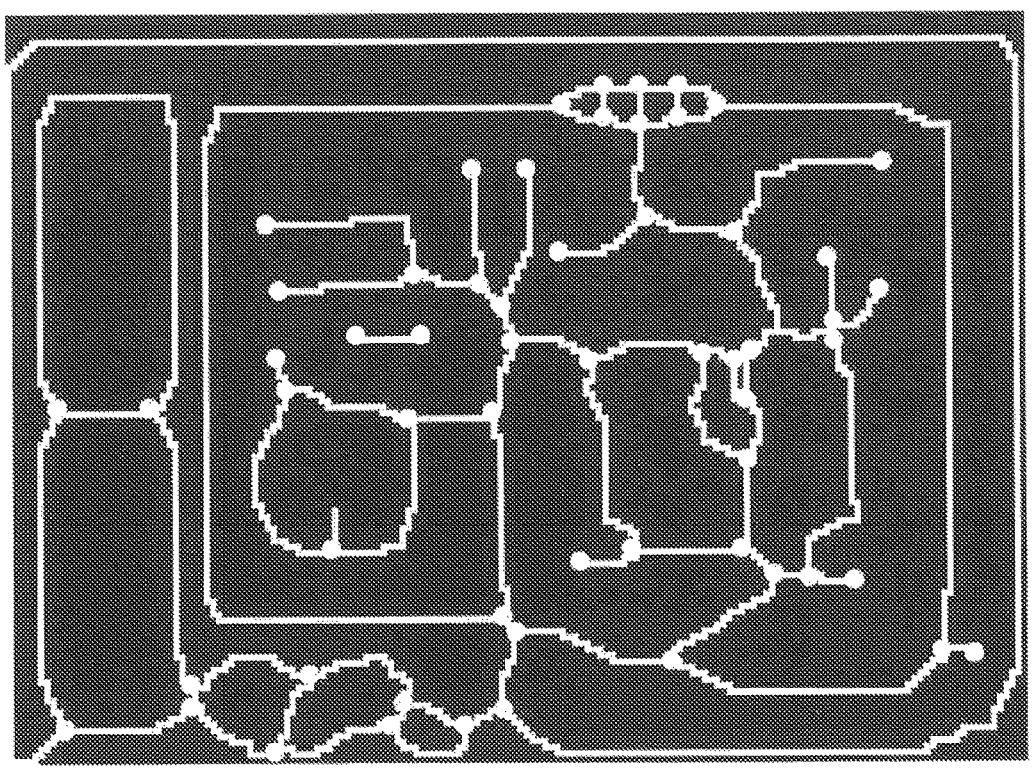
FIG. 16 is a diagram illustrating an example of a pathway on which nodes are displayed.

Next, the graph generation unit 105 of the route generation apparatus 1 performs a graph generation process (FIG. 3: S4). FIG. 15 is a process flow illustrating an example of the graph generation process. First, the graph generation unit 105 extracts nodes based on the route candidate map generated in the thinning process (FIG. 15: S21). In the step, corresponding pixels between the route candidate map illustrated in FIG. 14 and the attribute information partially illustrated in FIG. 7 are read in sequence, and cells that overlap with fittings (doors), opening parts or stairs, and cells in which the values are 3 or 4 (cells that diverge into three or four) are extracted as nodes (apexes). FIG. 16 illustrates an example in which the nodes extracted in S21 are displayed as circles. Here, the position of the node can be expressed, for example, as the coordinates on the floor plan that correspond to the center of the cell.

Then, the graph generation unit 105 performs the search of edges (S22). In the step, for example, one node on the graph is adopted as the starting point, and the search is started in the direction of a cell that is of the adjacent cells and in which the value in the route candidate map is 2. Further, in the case where another node is found by the search, the mutual connection relation is stored using the identification information of the node and path. Here, the edge may be expressed as an array of coordinates on the floor plan. Further, for example, a flag may be set for the searched cell, and the search in the reverse direction may be prevented.

FIG. 17 is a table illustrating an example of the data structure of the node that is held in the storage unit. The data about the node includes the index number, the coordinate value (X, Y), the attribute type (the interior of a room, fitting, opening part or stairs), the identification number of the constituent element to which the node belongs, the number of connected edges, and each value of the index numbers of the connected edges. Here, the value of the attribute type is determined based on the R component of the above-described route search image. Further, the identification number of the constituent element to which the node belongs is determined based on the G and B components of the above-described route search image. FIG. 18 is a table illustrating an example of the data structure of the edge that is held in the storage unit. The data about the edge includes the index number, the index numbers of the nodes at both ends, the identification number of the constituent element to which the edge belongs, the number of the apexes between the nodes, and each value of an apex (coordinate) list between the nodes. Here, the identification number of the constituent element to which the edge belongs is also determined based on the G and B components of the route search image. The data illustrated in FIG. 17 and FIG. 18 is stored for all nodes and edges that are obtained by the search, and the graph generation process is ended.

Figure 19:
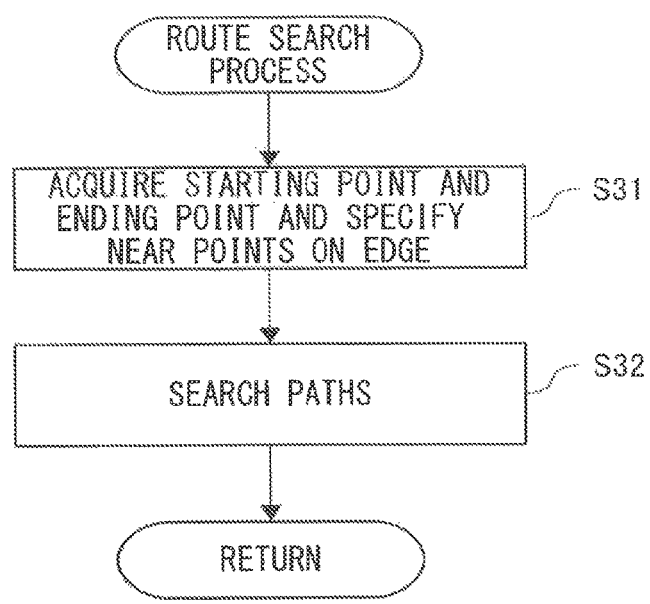
FIG. 19 is a process flow illustrating an example of a route search process.

Thereafter, the route search unit 106 of the route generation apparatus 1 performs a route search process (FIG. 3: S5). FIG. 19 is a process flow illustrating an example of the route search process. The route search unit 106, for example, receives the input of a departure spot and arrival spot of the movement from the user, and sets near points on the edge in the same room as the input points, as the starting point and the ending point (FIG. 19: S31). Here, the near point may be a node that is an endpoint of the edge. Further, whether the points are in the same room can be judged based on the identification number of the constituent element that is held in the G and B components in S2. As the search of the near point, for example, a nearest neighbor search may be linearly performed using the apex list between the nodes that is contained in the data about the edge illustrated in FIG. 18, or an existing approximate nearest neighbor search technique may be used.

Figure 20:
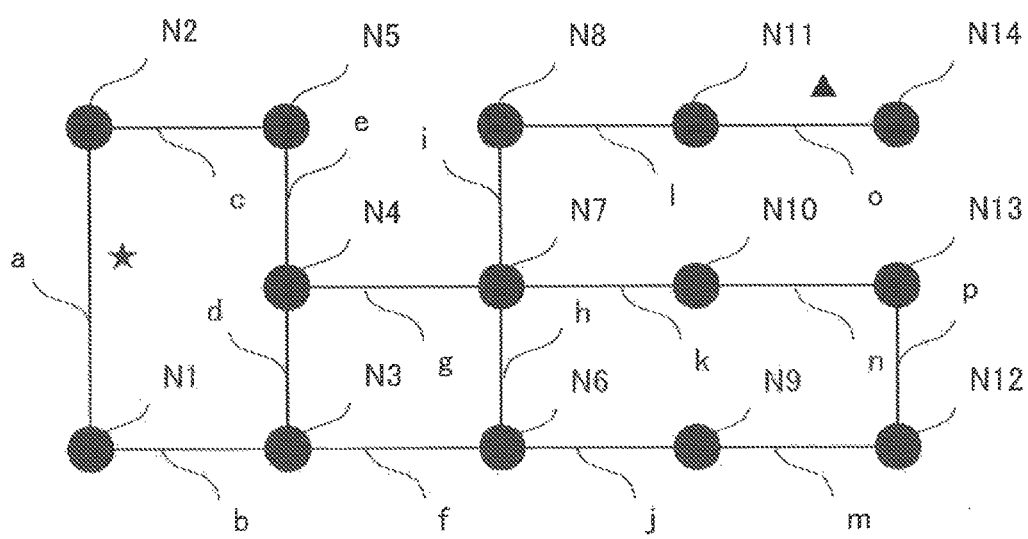
FIG. 20 is a diagram illustrating an example of a schematic graph for describing the search of routes.

Further, the route search unit 106 searches paths that are routes to be formed by connecting edges from the starting point to the ending point (S32). In the step, for example, the routes are linearly searched. FIG. 20 is a diagram illustrating an example of a schematic graph for describing the search of the routes. The graph in FIG. 20 contains a node N1 to a node N14. Further, the node N1 to node N14 are connected by an edge a to an edge p. Specifically, a connects N1 and N2, b connects N1 and N3, c connects N2 and N5, d connects N3 and N4, e connects N4 and N5, f connects N3 and N6, g connects N4 and N7, h connects N6 and N7, i connects N7 and N8, j connects N6 and N9, k connects N7 and N10, l connects N8 and N11, m connects N9 and N12, n connects N10 and N13, o connects N11 and N14, and p connects N12 and N13. Further, it is assumed that the user designates, as the departure spot, the star-mark place near the edge a illustrated in FIG. 20, and designates, as the arrival spot, the triangle-mark place near the edge o.

FIG. 21 is a table illustrating a specific example of the data about the node that is contained in FIG. 20. In the example of FIG. 21, with respect to the nodes whose node indexes are N1 to N14, the coordinates (X, Y), the attribute type expressing the constituent element in the floor plan that is indicated by the node, the identification information of the constituent element that is indicated by the node, the number of the edges connected with the node, and the list of the edges connected with the node are held.

FIG. 22 is a table illustrating a specific example of the data about the edge that is contained in FIG. 20. In the example of FIG. 22, with respect to the edges whose edge indexes are a to p, the indexes of the nodes at both ends, the attribute type expressing the constituent element in the floor plan that is indicated by the edge, the number of the apexes through which the edge goes, and the list of the apexes through which the edge goes are held.

In S31 of FIG. 19, it is assumed that a point that is present on the constituent element having the same identification information as the departure spot indicated by the star mark and that is on the closest edge a is specified as the starting point. Further, it is assumed that a point that is present on the constituent element having the same identification information as the arrival spot indicated by the triangle mark and that is on the closest edge o is specified as the ending point.

In S32 of FIG. 19, for example, a depth-first search is performed. Further, the passage through the same node is performed only once. In the case of returning to an already passed node or in the case of arriving at an endpoint node that is not the ending point, the search of the path is terminated, and unsearched branches are searched from the closest diverging point. Further, in the case of arriving at an ending point, the list of the edges contained in the found path is stored in the storage unit 101, and in the case where there is an unsearched branch, the search of another path is continued from there.

FIG. 23 is a table illustrating a specific example of the data about the path that is stored in the storage unit 101. The table in FIG. 23 contains the identification information of the path, the number of via-edges, and the list of the via-edges. Here, in each edge, the direction from a node having a small index numeral toward a node having a large index numeral is referred to as the forward direction, and the reverse is referred to as the reverse direction. In the list of the via-edges, for each edge, "forward" indicating the forward direction or "reverse" indicating the reverse direction is registered as the movement direction. As can be seen from FIG. 23, the search is performed from the starting point, both in the forward direction and in the reverse direction.

By such a process, all paths that arrives at the ending point from the starting point are extracted, and the process flow returns to the process in FIG. 3. Here, in S32, it is allowed to generate an edge from the departure spot input by the user in S31 to the starting point that is the near point, and an edge from the ending point to the arrival spot input by the user, and to add them to the front and back of the path. By the route search process, a route expressed by coupling coordinate arrays is extracted, for example, as illustrated by a thick line in FIG. 24. Here, in FIG. 24, the candidates of the pathway illustrated in FIG. 14 are illustrated by the aggregation of dots. Here, in the step, a plurality of routes are extracted.

Figure 25:
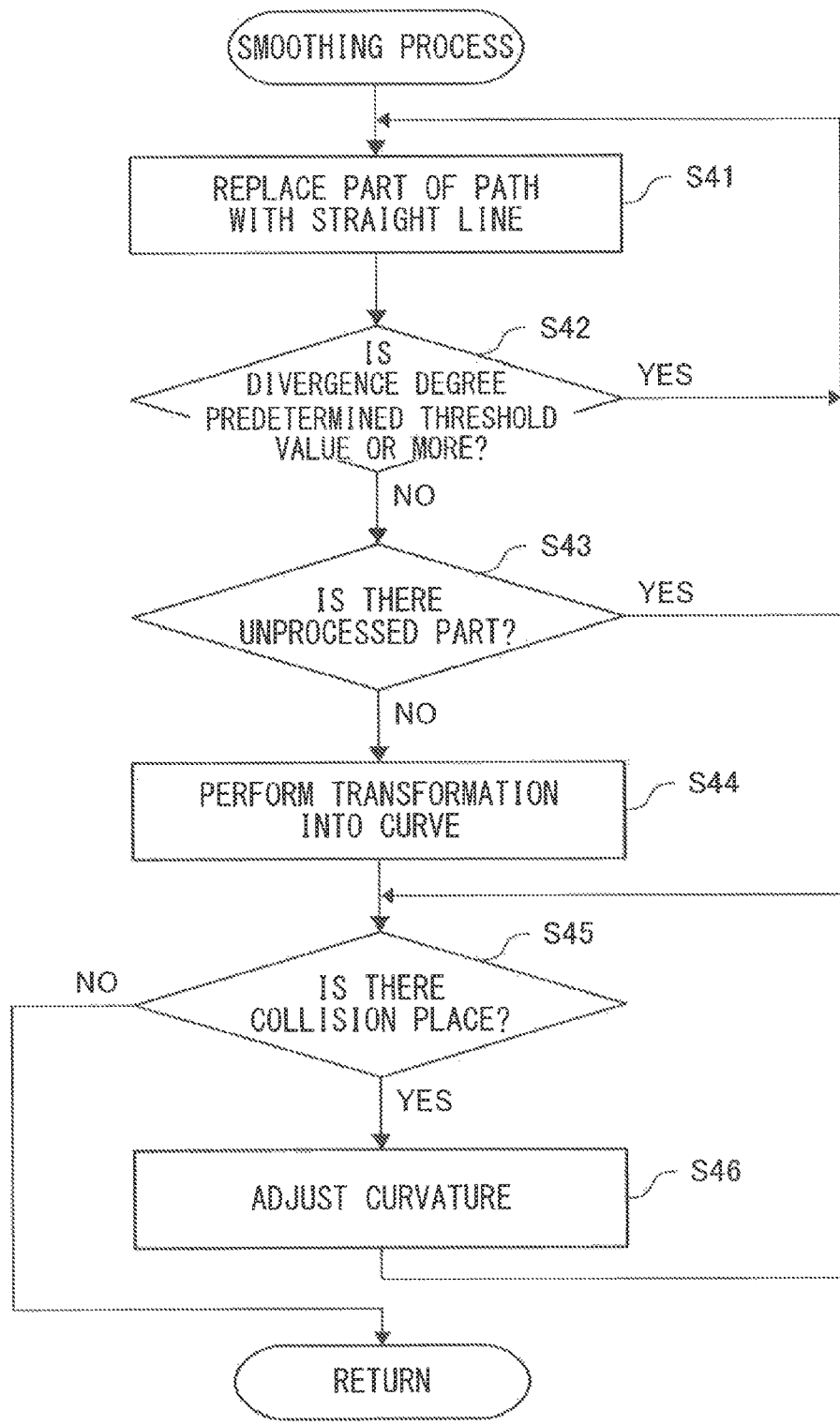
FIG. 25 is a process flow illustrating an example of a smoothing process.

Next, the smoothing unit 107 of the route generation apparatus 1 performs a smoothing process (FIG. 3: S6). FIG. 25 is a process flow illustrating an example of the smoothing process. Here, the smoothing unit 107 may perform the smoothing process for all of the paths that are extracted by the route search process, or may perform the smoothing process for a path that is short in the distance from the starting point to the ending point or a path that is selected by the user.

Figure 24:
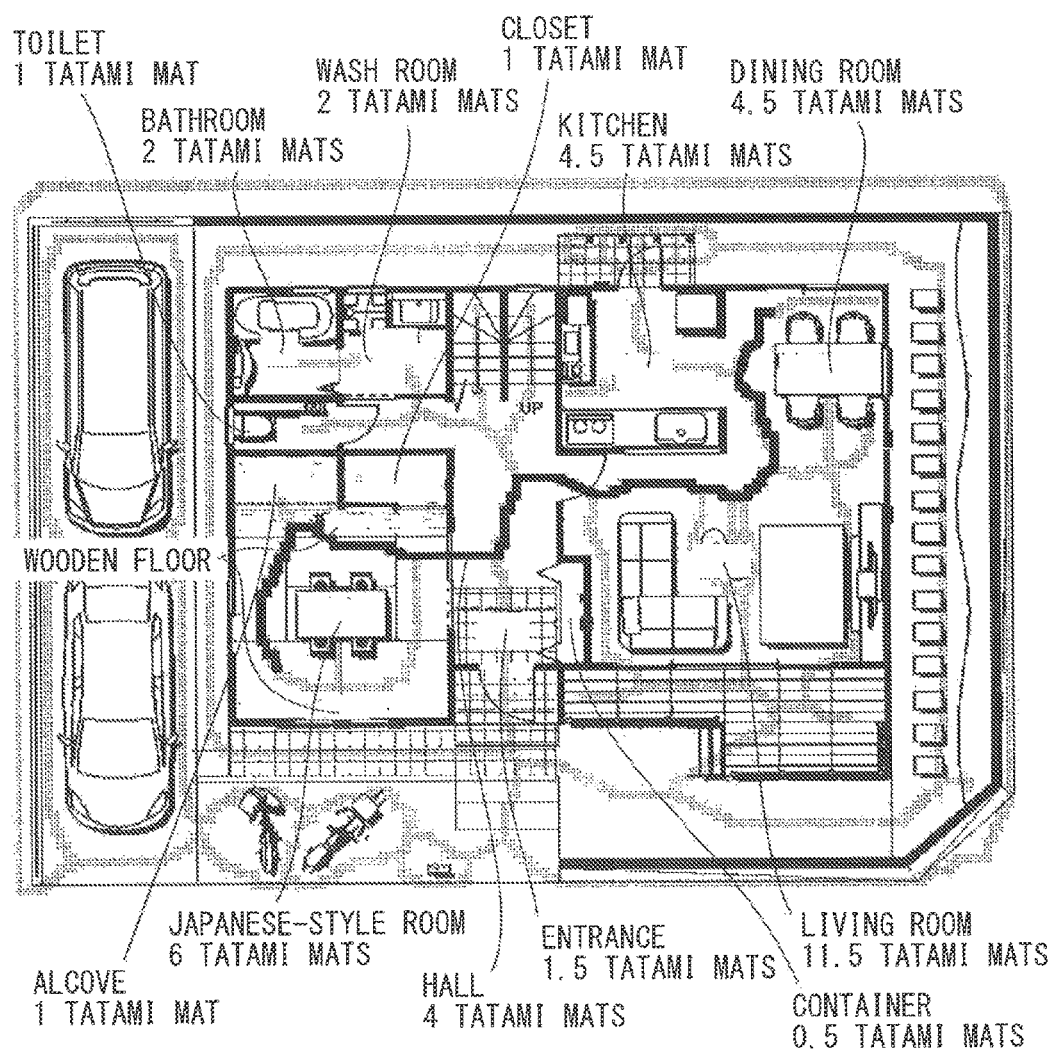
FIG. 24 is a diagram illustrating an example of a route displayed on the floor plan.
Figure 26:
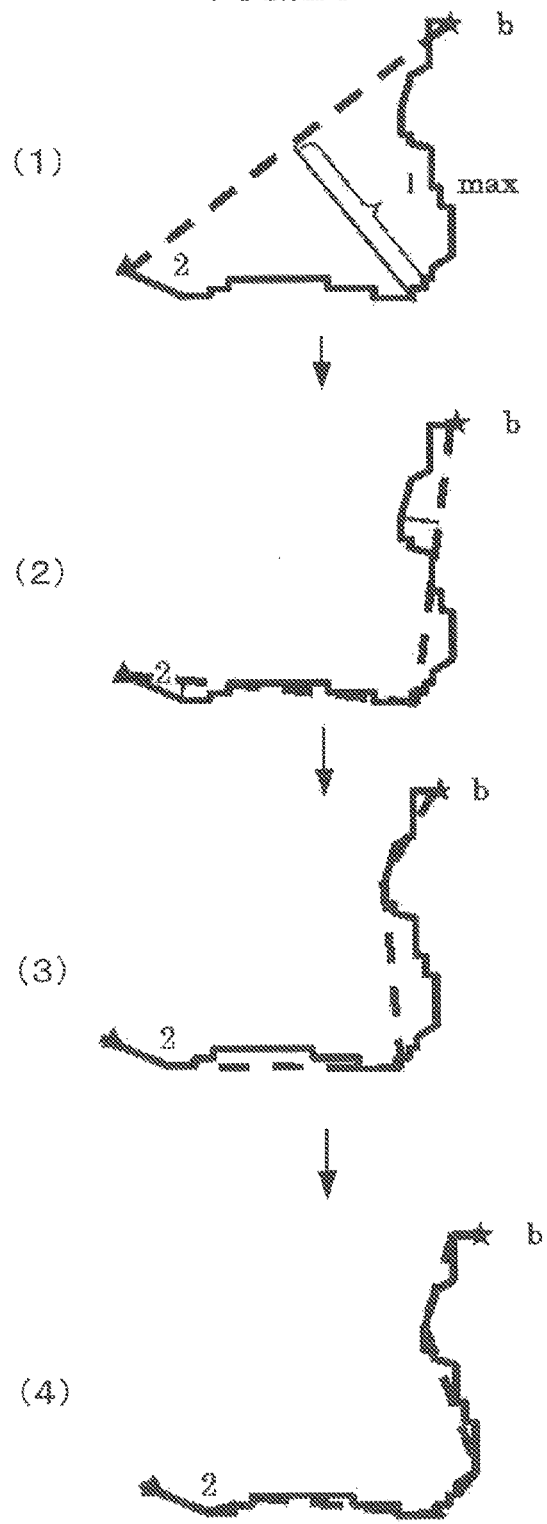
FIG. 26 is a diagram for describing the approximation of the path by a polygonal line.

First, the smoothing unit 107 replaces a part of the path with a straight line (FIG. 25: S41). In the step, the apex array contained in the path (edge) is separated in terms of the starting point, the ending point, the fitting (door), the opening part and the stairs, and the sections are joined by a straight line. Here, the reason for the separation in terms of the fitting (door) and the stairs is that a special process for changing the direction of the sight line in the opening/closing of the door and the climbing/descending of the stairs is performed when a walk-through is displayed later. The path illustrated in FIG. 24 is separated into four parts, from a starting point a illustrated by a circle mark through a door 1 and a door 2 illustrated by triangle marks to an ending point b illustrated by a star mark. For example, the apex array contained in the edges between the door 2 and the ending point b is replaced with a straight line, as illustrated in the top stage (1) of FIG. 26. In the example of FIG. 26, the replacement straight line is illustrated by a broken line.

Further, the smoothing unit 107 judges whether the divergence degree between the original path and the replacement straight line exceeds the predetermined threshold value (S42). Here, as the predetermined divergence degree, a threshold value L indicating the allowable range of the distance from the straight line after the replacement to the farthest point on the original path is set in advance. For example, the threshold value L is 10 cm. In the step, a perpendicular line is drawn from each apex array contained in the edges constituting the original path to the straight line after the replacement, and the maximum value Imax of the distance I is evaluated. Then, when Imax is the predetermined threshold value L or more (S42: YES), the process flow returns to the process of S41, and as illustrated by broken lines in the second stage (2) of FIG. 26, the original path is further divided at an apex where I is maximized, and is replaced with two straight lines. Then, in S42, whether the divergence degree between the original path and the straight line after the replacement exceeds the predetermined threshold value is judged for each straight line. Moreover, in the case of exceeding the predetermined threshold value, the straight line is further divided as illustrated in the third stage (3) of FIG. 26. On the other hand, in the case where the divergence degree between the straight line after the replacement and the original path is within the predetermined threshold value (S42: NO), whether there is an unprocessed straight line of the other divided straight lines is judged (S43). In the case where there is an unprocessed straight line (S43: YES), the processes of S41 and S42 are repeated. In this way, a polygonal line by which the original path is approximated is obtained as illustrated by broken lines in the fourth stage (4) of FIG. 26. For example, the route illustrated in FIG. 24 is transformed into a roughly polygonal line illustrated in FIG. 27. Here, the accuracy of the approximation can be changed by the magnitude of the threshold value L.

In the case where all divided straight lines have been processed (S43: NO), the smoothing unit 107 transforms the polygonal line by which the original path is approximated, into a curve (S44). In the step, the polygonal line generated by the above-described process is transformed into a curve such as a Bezier curve and a Hermitian curve.

Figure 28:
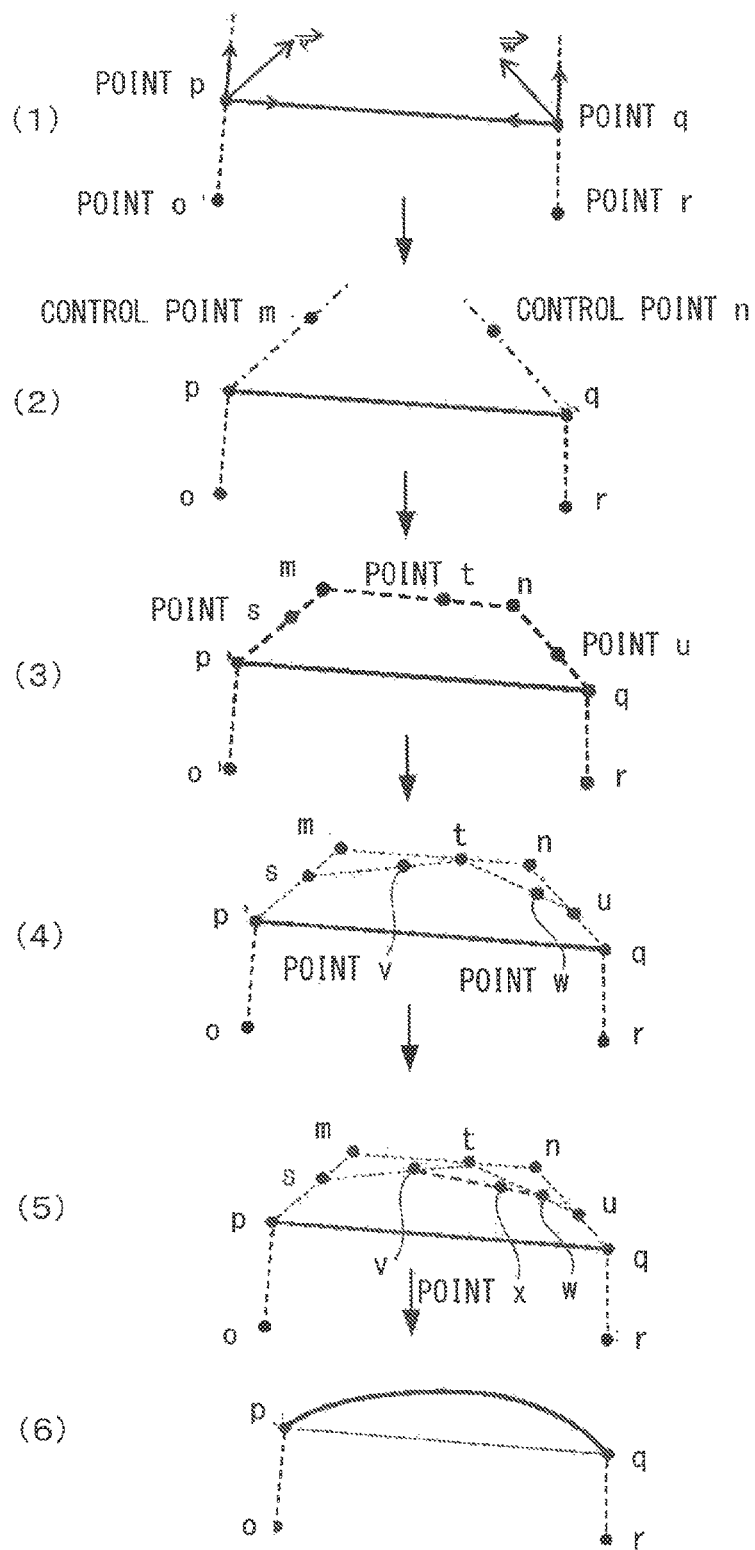
FIG. 28 is a diagram for describing the generation of a Bezier curve.

FIG. 28 is a diagram for describing the generation of a Bezier curve that passes through two points p, q. Here, a cubic Bezier curve has four control points, and passes through control points at both ends. In the embodiment, two control points are added between apexes of the polygonal line. Here, the two points p, q are a part of an apex array o, p, q, r contained in the polygonal line.

First, as illustrated in the top stage (1) of FIG. 28, using unit vectors resulting from respectively normalizing a vector op from the point o toward the point p and a vector pq from the point p toward the point q, a synthetic vector v of them is evaluated. Similarly, from unit vectors resulting from normalizing a vector rq and a vector qp, a synthetic vector w is evaluated. Then, the vector v and the vector w are adopted as the tangential directions at the point p and point q on the curve between the point p and the point q.

Next, the length l between the point p and the point q is evaluated. Then, a control point m and a control point n are newly generated at positions that are f-fold (0.0<f<0.5) of the length l away from the point p and point q in the directions of the vector v and vector w, respectively. The second stage (2) of FIG. 28 illustrates an example of the control point m and the control point n. Further, the control point m and the control point n are evaluated by the following formulas. As described later, by changing the magnitude of the value of f, it is possible to change the curvatures at the point p and the point q and thus the form of the curve.

Control Point $m = p + l \times f \times \vec{v}$

Control Point $n = p + l \times f \times \vec{w}$

Further, a point s, a point t and a point u that internally divide the interval between the points p and m, the interval between the points m and n and the interval between the points n and q at ratio: (1.0-ratio) respectively are generated. The third stage (3) of FIG. 28 illustrates an example of the point s, the point t and the point u. Further, the point s, the point t and the point u are evaluated by the following formulas.

Point $s = p + (m-p) \times \text{ratio}$

Point $t = m + (n-m) \times \text{ratio}$

Point $u = n + (q-n) \times \text{ratio}$

Moreover, a point v and a point w that internally divide the interval between the points s and t and the interval between the points t and u at ratio: (1.0-ratio) respectively are generated. The fourth stage (4) of FIG. 28 illustrates an example of the point v and the point w. Further, the point v and the point w are evaluated by the following formulas.

$$\text{Point } v = s + (t-s) \times \text{ratio}$$

$$\text{Point } w = t + (u-w) \times \text{ratio}$$

Then, a point x that internally divides the interval between the points v and w at ratio: (1.0-ratio) is generated. The fifth stage (5) of FIG. 28 illustrates an example of the point x. Further, the point x is evaluated by the following formula.

$$\text{Point } x = v + (w-v) \times \text{ratio}$$

Figure 27:
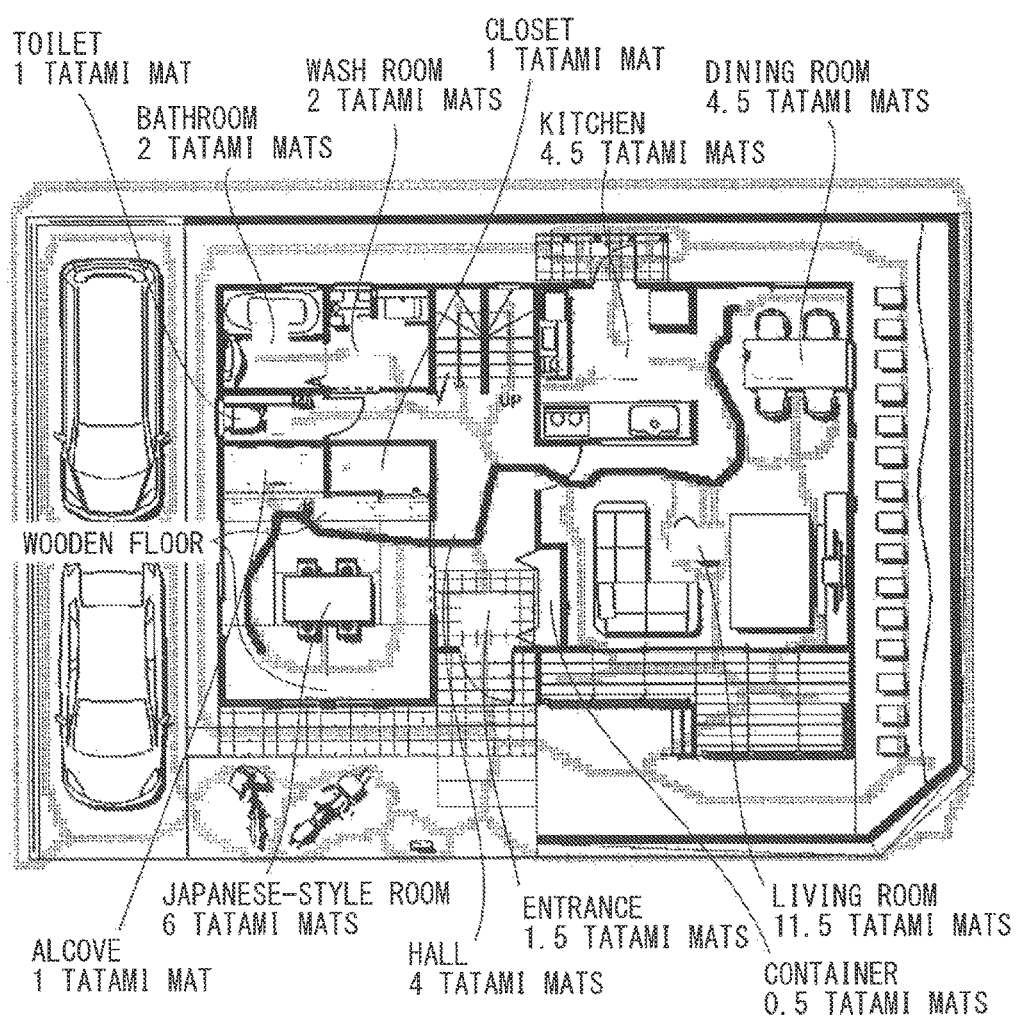
FIG. 27 is a diagram illustrating an example of the polygonal line for approximating the route displayed on the floor plan.

Here, the locus of the point x that is produced when ratio is continuously changed from 0.0 to 1.0 is illustrated in the sixth stage (6) of FIG. 28. In this way, the route on the floor plan is transformed into a curve that changes smoothly. For example, the polygonal-line route illustrated in FIG. 27 is transformed into a curve illustrated in FIG. 29. By transforming the movement route into a curve on the plane, the route generated by the route generation apparatus 1 can express a natural movement when the display of the walk-through is performed.

Figure 29:
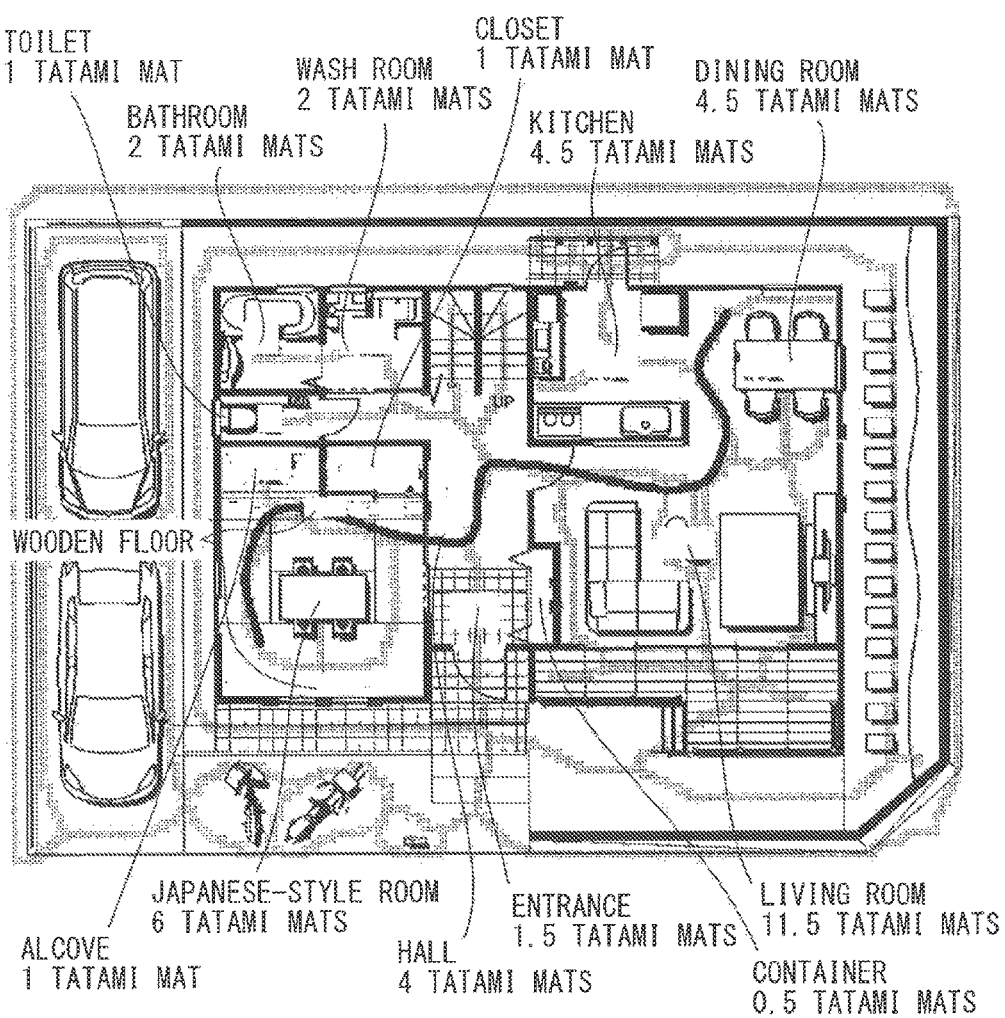
FIG. 29 is a diagram illustrating an example of a curve route displayed on the floor plan.

Thereafter, the smoothing unit 107 judges whether the generated curve route does not collide with the impassable cell on the route search image (FIG. 25: S45). In the step, for example, for the route of the movement candidate that is expressed by the curve, coordinates on the curve are evaluated at a predetermined interval, for example, at a 10 cm interval. Then, in the case where the evaluated coordinates are contained in the impassable cell on the route search image, it is judged that the curve route collides with the impassable cell. In the example of FIG. 29, the judgment of no collision is made (S45: NO), and the process flow returns to the process in FIG. 3.

Figure 30:
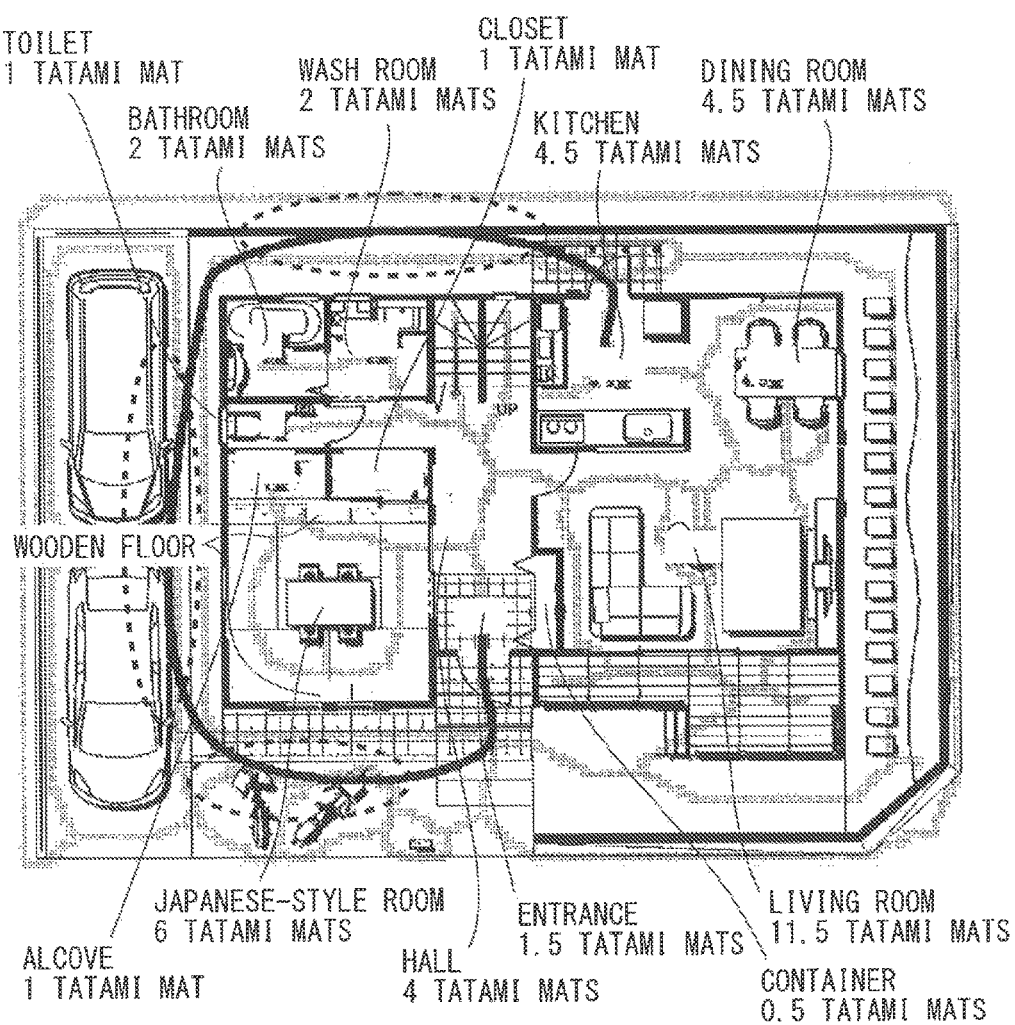
FIG. 30 is a diagram illustrating an example of the collision of the curve route with an impassable cell.

On the other hand, in the case where the generated curve route passes through the impassable cell (S45: YES), the smoothing unit 107 adjusts the curvature of the generated curve (S46). FIG. 30 is a diagram illustrating an example of the collision of the curve route with the impassable cell. FIG. 30 illustrates an example of a route that passes through the outer circumference of the house to move between the entrance and the kitchen. Further, in the example of FIG. 30, it is judged that the curve route collides with fences for marking off a bicycle parking lot in the front of the house and a car parking lot beside the house, and a wall in the back of the house, as illustrated by broken-line ellipses. Here, in the case where the judgment of the collision is made in S45, if the display of the walk-through is performed using the generated curve route, the movement is performed by running through some constituent elements that are essentially impassable. Therefore, in the embodiment, the curvature at the point on the route is changed such that the curve route avoids the impassable cell. In the step, for example, parameters are added to the formulas used for the calculation of the control point m and the control point n, and the curve to be generated is corrected.

Specifically, in the case of the Bezier curve, the value of f is decreased in the above-described calculation formulas for the control point m and the control point n. Thereby, the swell of the curve between the points p and q is decreased, resulting in a form close to a straight line. For example, as described below, in the calculation formulas for the control point m and the control point n, f is multiplied by a predetermined coefficient adj ($0.0 \leq \text{adj} \leq 1.0$).

$$\text{Control Point } m = p + l \times f \times \text{adj} \times \vec{v}$$

$$\text{Control Point } n = p + l \times f \times \text{adj} \times \vec{w}$$

FIG. 31 is a diagram for describing the curve that is finally generated in the case of the multiplication by the coefficient adj in the calculation of the control points. The top stage (1) of FIG. 31 illustrates a curve that is generated by the above-described calculation formulas for the control point m and the control point n. Further, the bottom stage (2) of the FIG. 31 illustrates a curve that is generated in the case where f is multiplied by the coefficient adj. The adj is a value of 0 or more and 1.0 or less, and in the example of FIG. 31, is 0.75. Thereby, the distance from the point p to the control point m and the distance from the point q to the control point n are multiplied by the coefficient adj, and the positions of the control point m and the control point n come close to the point p and the point q, respectively. Accordingly, the positions of the point s to the point x come close to a line segment pq, and therefore, the curve to be drawn as the locus of the point x becomes close to a straight line.

Figure 32:
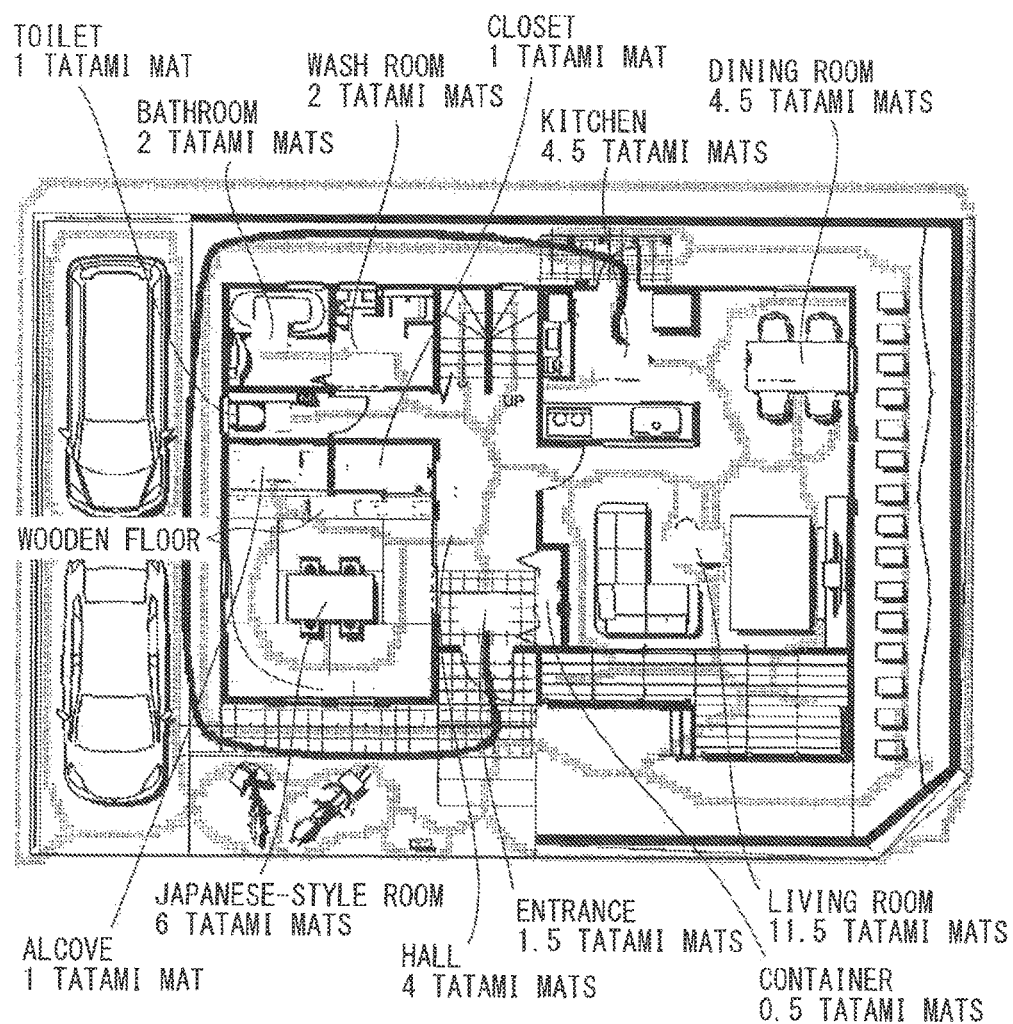
FIG. 32 is a diagram illustrating an example of the correction of the curve route displayed on the floor plan.

After S46, the process flow returns to S45, and the process is repeated. Specifically, in S45, whether the curve after the curvature is changed collides with the impassable cell is judged. In the case where it is judged that the curve after the curvature is changed also collides with the impassable cell (S45: YES), the smoothing unit 107 further adjusts the curvature of the curve in S46. For example, in the calculation formulas for the control point m and the control point n, the multiplication by the above-described coefficient adj may be performed twice, or the value of the coefficient adj may be further decreased. Thereby, the curve judged as the collision with the impassable cell is made to be further close to a straight line. Here, for example, in the case where the route passes through an extremely narrow gap on the floor plan, there is a possibility that the collision cannot be avoided even when the curvature of the curve is adjusted. Therefore, the loop of the processes of S45 and S46 may be terminated in the case of being repeated a predetermined number of times. FIG. 32 illustrates a result after the curvatures are respectively adjusted for the three places where the curve route collides with the impassable cells in FIG. 30.

Thereafter, based on the smoothed movement route, the walk-through display unit 108 of the route generation apparatus 1 performs the walk-through display that moves in the three-dimensional model related to the floor plan (FIG. 3: S7). By performing such a process, the route generation apparatus 1 according to the embodiment can generate a more natural movement route.

<Modification>

The present disclosure is not limited to the above-described embodiment, and can be altered in the range without departing from the spirit of the present disclosure. For example, in the process flow illustrated in the embodiment, the order of the processes may be altered, unless the result is different. Further, some of the processes may be executed by another computer, and the other computer may be connected through a non-illustrated network. Further, the above embodiment and the following modifications can be carried out while being combined if it is possible.

The movement route according to the embodiment is transformed into the curve by performing the smoothing process, and thereby, it is possible to express a natural movement. However, the display of the walk-through may be performed, for example, based on the polygonal line generated in S41 or the path obtained by the route search process of S5. Such a route is also a route that is generated depending on the distance from the outer edge of the passable region, and is a natural movement route that is less likely to give the user a feeling of strangeness.

<Modification of Curve>

Figure 33:
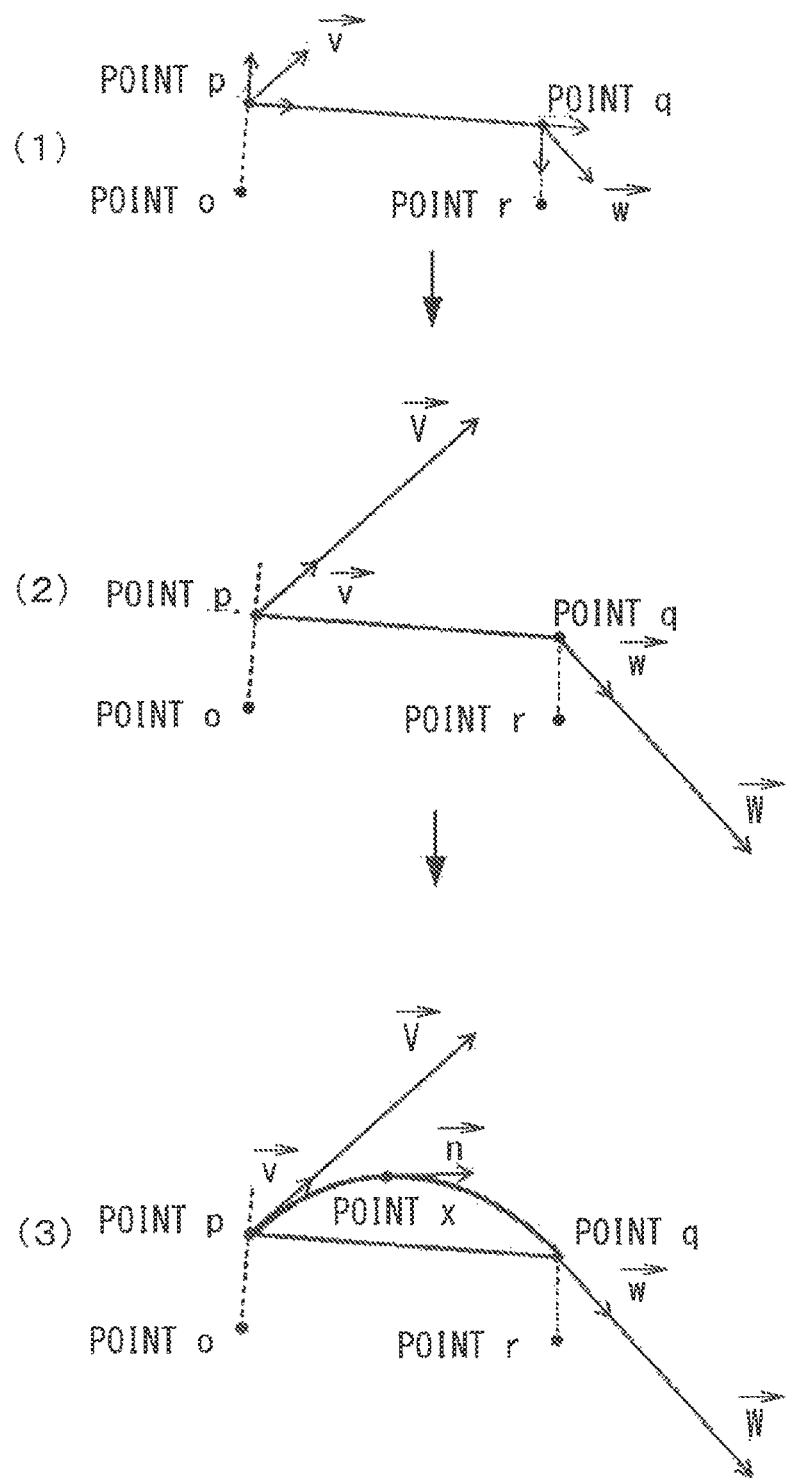
FIG. 33 is a diagram for describing the generation of a Hermitian curve.

The curve for the transformation in S44 is not limited to the Bezier curve. For example, the Hermitian curve or the like may be adopted. FIG. 33 is a diagram for describing a procedure of generating a curve using the Hermitian curve. Similarly to the example of the Bezier curve, in FIG. 33, the interval between the points p and q of the point array o, p, q, r is transformed into a curve.

As illustrated in the top stage (1) of FIG. 33, the unit vector resulting from normalizing the vector op from the point o toward the point p and the unit vector resulting from normalizing the vector pq from the point p toward the point q are synthesized, and thereby, the synthetic vector v is evaluated. Similarly, the unit vector resulting from normalizing the vector pq from the point p toward the point q and the unit vector resulting from normalizing the vector qr from the point q toward the point r are synthesized, and thereby, the synthetic vector w is evaluated. The synthetic vector v and the synthetic vector w are the tangential directions at the point p and point q on the curve between the points p and q, respectively.

Further, as illustrated in the second stage (2) of FIG. 33, the length l between the points p and q is evaluated, and a vector V and a vector W are calculated based on the following formulas. Here, a coefficient f is a parameter for adjusting the form of the curve, and $0.0<f<2.0$ holds.

$$\vec{V}=\vec{v}\times l\times f$$

$$\vec{W}=\vec{w}\times l\times f$$

Then, the point x on the curve between the points p and q and a vector n indicating the tangential direction at the point x are described as follows. As illustrated in the third stage (3) of FIG. 33, also in the case of the Hermitian curve, the locus of the point x in the case where ratio is changed from 0.0 to 1.0 is adopted as the curve between the points p and q.

$$x=p\times(2\times\text{ratio}^3-3\times\text{ratio}^2+1)+$$
$$\vec{V}\times(\text{ratio}^3-2\times\text{ratio}^2+\text{ratio})+q\times(-2\times\text{ratio}^3+3\times\text{ratio}^2)+$$
$$\vec{W}\times(\text{ratio}^3-\text{ratio}^2)$$

$$\vec{n}=3\times(2\times p+\vec{V}-2\times q+\vec{W})\times\text{ratio}^2+2\times(-3\times p-2\times\vec{V}+3\times q-\vec{W})\times\text{ratio}+\vec{V}$$

Figure 34:
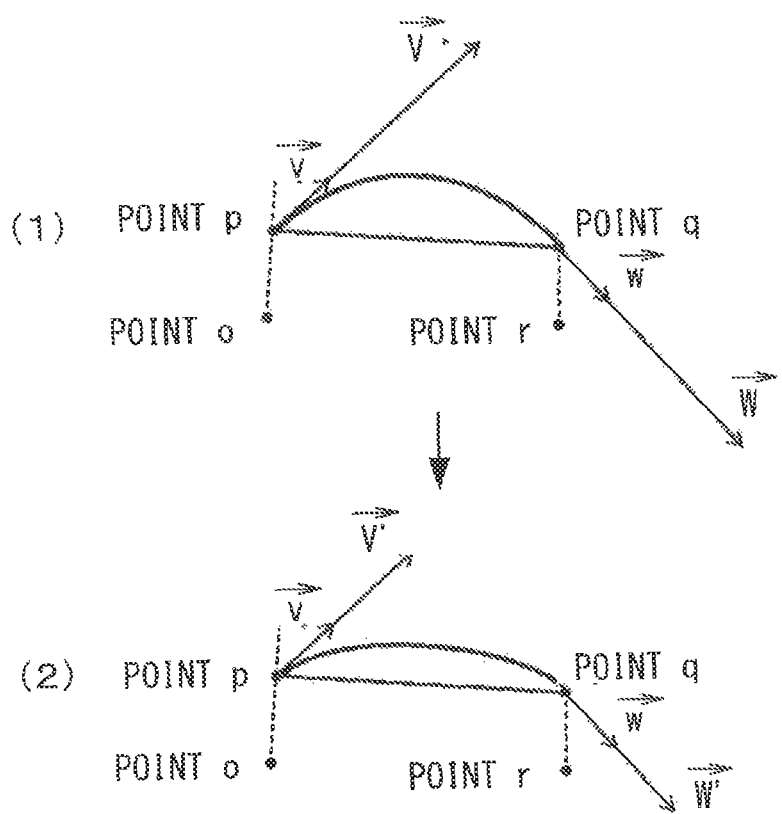
FIG. 34 is a diagram for describing the change in curvature at a point on the Hermitian curve.

Further, for the adjustment of the curvature in S46, similarly to the case of the Bezier curve, the parameter is adjusted such that the value of the coefficient f is decreased, in the calculation formulas for the vector V and the vector W, and thereby, the swell of the curve can be reduced. For example, in the case where the curve illustrated in the top stage (1) of FIG. 34 collides with the impassable cell, a vector V and a vector W' after the curvature adjustment are evaluated by the multiplication by a coefficient adj ($0.0<\text{adj}<1.0$), as illustrated in the bottom stage (2) of FIG. 34. Thereby, it is possible to decrease the swell of the curve and to make the curve close to a straight line. Here, in the second or later processing of S46, similarly to the case of the Bezier curve, the number of times of the multiplication by the coefficient adj is increased, or the value of the coefficient adj is decreased.

$$\vec{V'}=\vec{v}\times l\times f\times\text{adj}$$

$$\vec{W'}=\vec{w}\times l\times f\times\text{adj}$$

<Modification of Noise Removal>

In the process for removing noise illustrated in the S15 of FIG. 8, a pathway candidate shorter than a predetermined threshold value may be eliminated. Here, the threshold value is a positive integer, and is determined in advance. Herein, the threshold value is "5".

In this case, first, in S5, cells having a value of 1 are extracted from the thinned map, as described above, and for each of the extracted cells, the value is replaced with a value that is less by 1 than the minimum value of the eight near cells (−1 if the minimum value is 0).

Next, a cell in which the value contained in the thinned map is 2 is extracted, and in the case where only one cell of the eight near cells around the extracted cell has a value of 1 or more, the value of the extracted cell is replaced with 1. Further, in the case where two or more cells of the eight near cells around the cell in which the value in the thinned map is 2 have a value of 1 or more and where at least one of the cells that are of the eight near cells and that have a value of 1 or more is not adjacent, the value of the cell is kept to 2. Further, in the case where two or more cells of the eight near cells around the cell in which the value in the thinned map is 2 have a value of 1 or more and where all of the cells that are of the eight near cells and that have a value of 1 or more are connected, the value is replaced with a value that is less by 1 than the minimum value of the eight near cells around the cell (−2 if the minimum value is −1).

Then, after the cells having a value of 2 are all processed, cells having the above described value of 1 are extracted and replacing each of the extracted cells with a value that is less by 1 than the minimum value of the eight near cells is performed again, and the processes are repeated until the cells having a value of 1 are eliminated.

Next, cells having values that are less than the threshold value in which plus/minus is inverted (the value in which minus is put to the threshold value, for example, −5 if the threshold value is 5) are extracted from the thinned map after the above-described process, and the values of the extracted cells are restored to 2. Moreover, cells that are of the eight near cells around the extracted cell and that have minus values are extracted, and the values of the extracted cells are restored to 2. Then, the process of extracting cells having values that are less than the threshold value in which plus/minus is inverted is performed again, and the processes are repeated until the cell having a minus value cannot be extracted from the eight near cells. Here, when the cell having a minus value cannot be extracted from the eight near cells, for the last cell in which the value was restored to 2, the value is replaced with 1.

By such a process, one of the values from the threshold value in which plus/minus is inverted to −1 is put in the cells on pathway candidates that are shorter than the threshold value. Therefore, these cells are extracted, and the values are replaced with 0. Thereby, it is possible to eliminate the pathway candidates that are shorter than the threshold value.

Figure 35:
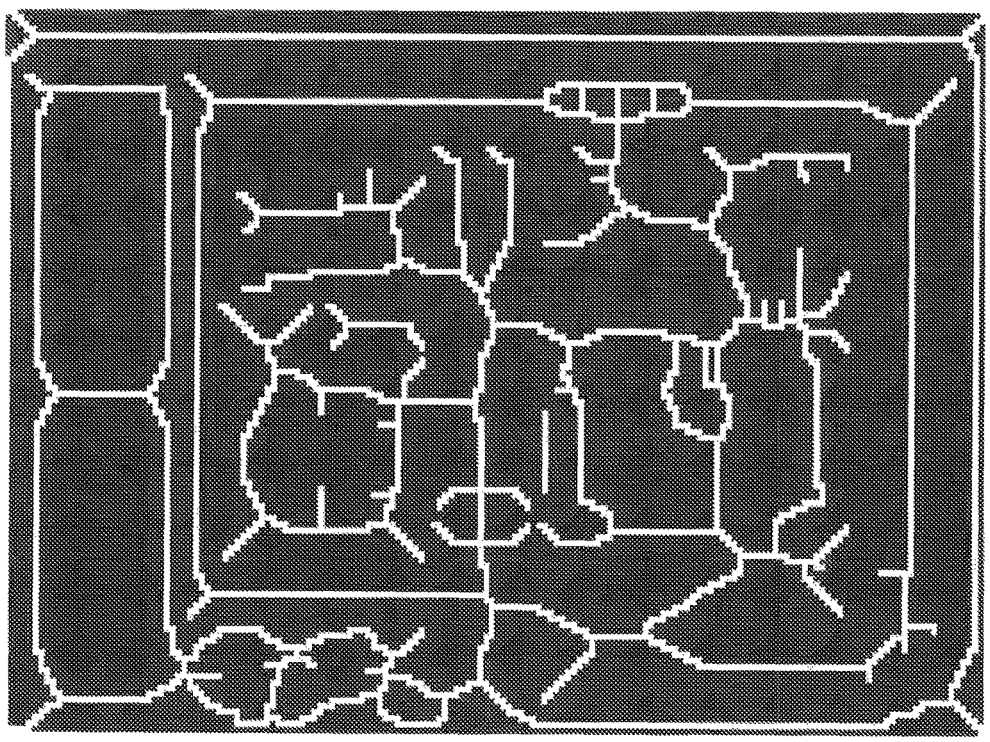
FIG. 35 is a diagram for describing a modification of the noise removal.

In FIG. 35, a route candidate map after the noise removal according to the modification is generated. It is found that whisker-like lines longer than the predetermined threshold value are left in FIG. 35 compared to the example of FIG. 14. Radial edges extending from the center of the room toward the corners of the room are generated, and therefore, even when the user designates a corner of the room or the like as the departure spot or the arrival spot, the near point is found at a position near the designated spot, compared to the example of FIG. 14.

<Collection of Nodes>

Figure 36:
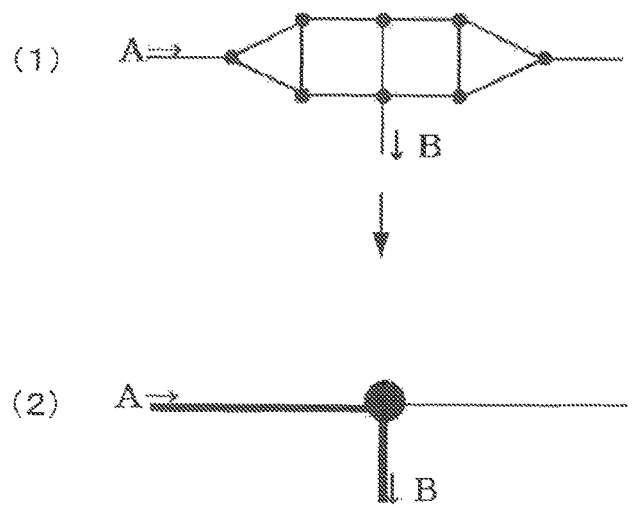
FIG. 36 is a diagram for describing a process for the case where there are a plurality of nodes in a narrow range.

FIG. 36 is a diagram for describing a process for the case where there are a plurality of nodes in a relatively narrow range. When the search of the route is performed in S32 of FIG. 19, in the case where there is a route in which the total of the lengths of the edges is a predetermined threshold value (for example, 300 cm) or less and that returns to an already passed edge, for example, a flag is set for nodes and edges through which the route passes on the way, and the extraction is performed. Then, the extracted nodes and edges are replaced with a single virtual node, and the route search in S32 is performed. For example, in the case where the aggregation of nodes and edges illustrated in the top stage (1) of FIG. 36 is extracted, the replacement with a single node is performed as illustrated in the bottom stage (2) of FIG. 36. In the case where there is the aggregation of nodes and edges illustrated in the top stage (1) of FIG. 36, there are a plurality of routes that extend from A toward B. However, in the light of the whole route, there is sometimes only a slight difference in the way to pass through that part. That is, when there is the aggregation of nodes and edges that form a loop in a relatively narrow range, there is a fear of unnecessarily increasing variations that have substantially no difference as the route of the walk-through. Therefore, in the modification, the apex array (the aggregation of nodes and edges) in which the total of the lengths of the edges is the predetermined threshold value or less and that forms a loop is replaced with a single virtual node, and thereby, the number of routes to be searched is reduced. Here, the extracted aggregation of nodes and edges may be replaced with the virtual node, only in the case of satisfying the condition that they are present in an identical room or space. For example, by using the identification information of the constituent element that is held in the G and B components of the route search image, it is possible to judge whether the apex array contained in each node or edge is present in an identical room or space.

<Route Extending Across Floors>

Figure 37A:
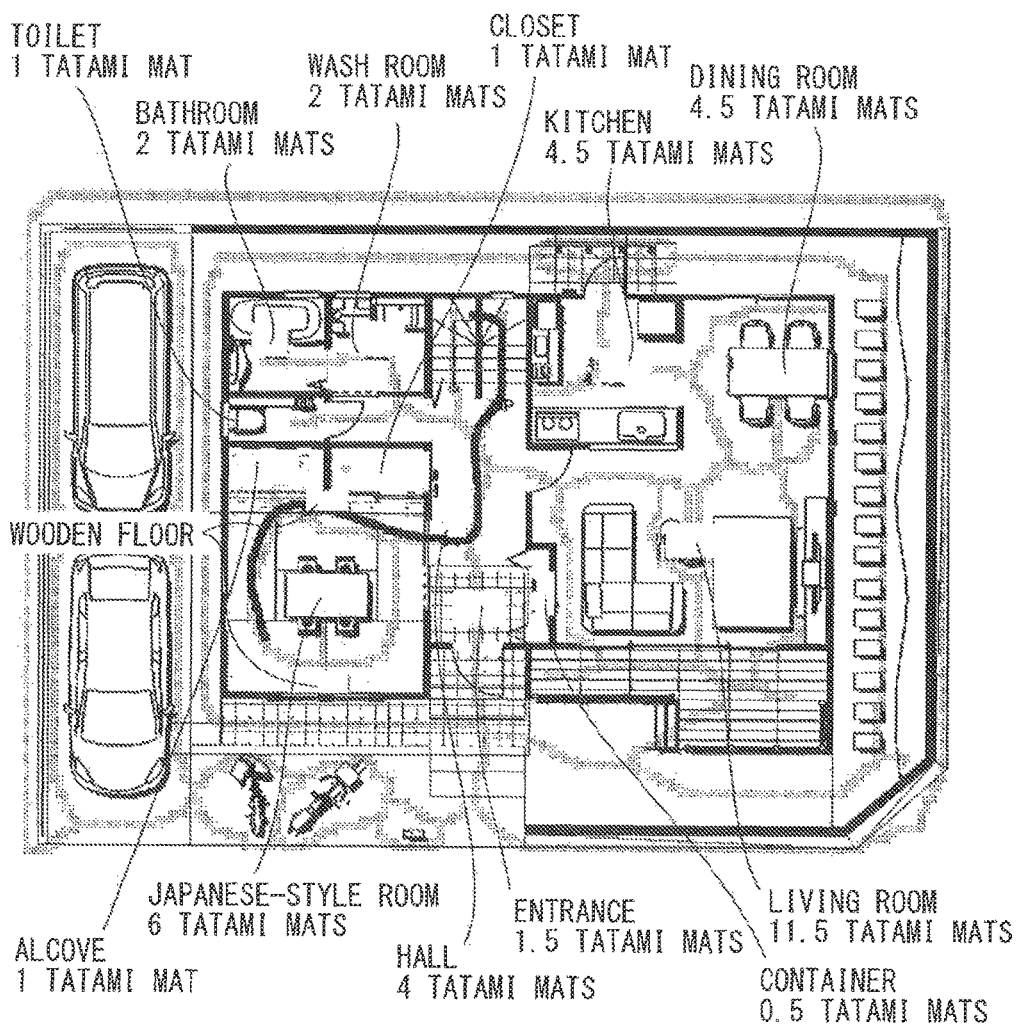
FIG. 37A is a diagram illustrating an example of a first floor part of a route that extends across floors.
Figure 37B:
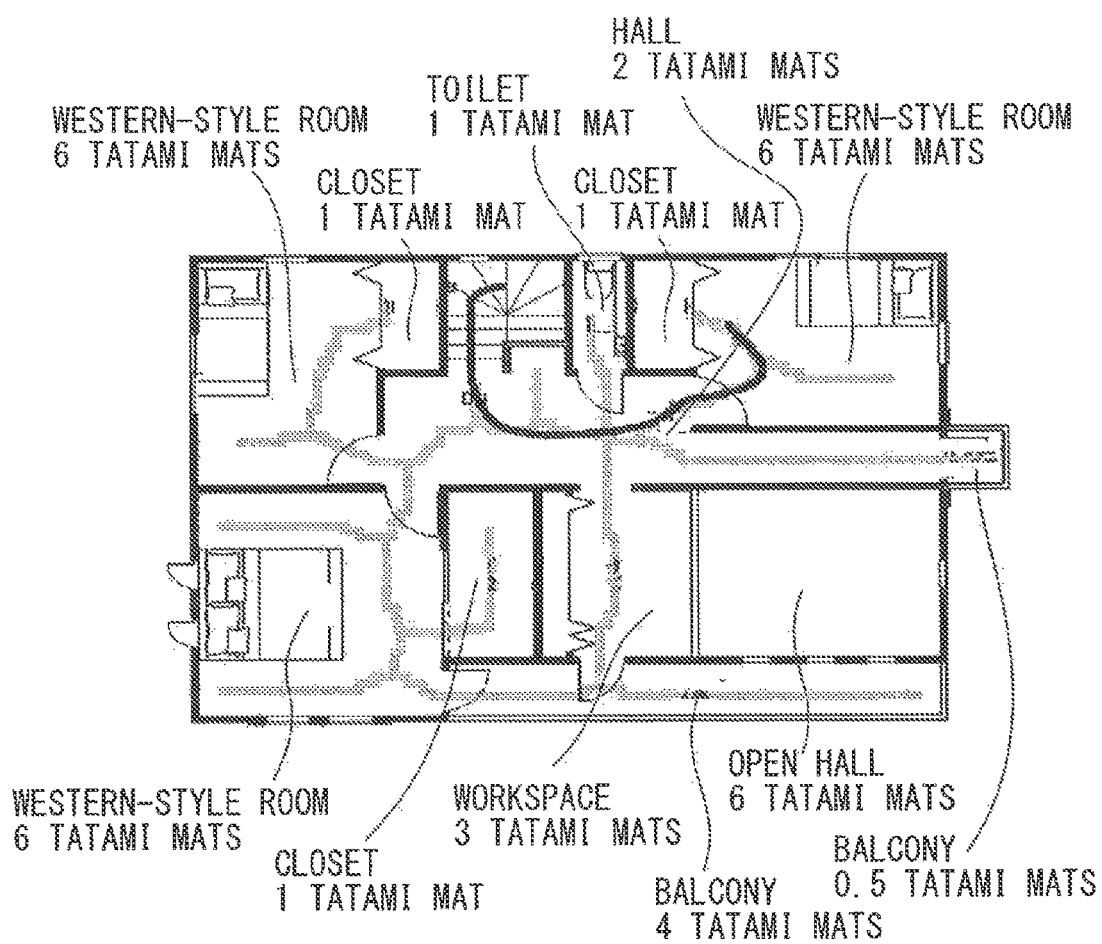
FIG. 37B is a diagram illustrating an example of a second floor part of the route that extends across the floors.

In the above-described example, the route for the case where the starting point and the ending point are present on an identical floor is evaluated, but the starting point and the ending point may be present on different floors. In this case, the graph generation process is performed for each floor in S4 of FIG. 3, and the nodes and the edges are evaluated. Here, for one or more stairs, elevators or the like that are present on different floors, the correspondence relation can be judged based on the identification information of the constituent element that is held in the G and B components of the route search image. Then, in the route search process of S5, a first route from the starting point to the stairs or the like on a certain floor and a second route from the stairs or the like to the ending point on another floor are evaluated. Then, the first route and the second route are linked, and thereby, a route that extends across the floors is generated. FIG. 37A and FIG. 37B are diagrams illustrating an example of a route from a Japanese-style room on the first floor to a Western-style room on the second floor. FIG. 37A illustrates a route from the starting point in the Japanese-style room to the stairs. FIG. 37B illustrates a route from the stairs to the Western-style room. In the exemplified house, the floors are connected by one set of stairs. However, even in the case of having plural sets of stairs or elevators, identical routes are connected by the identification information of the constituent element related to the stairs or the like, and thereby, it is possible to present a route that extends across the floors.

<Via-Spot>

In the above-described example, the starting point and the ending point are set based on the operation by the user. Furthermore, a via-spot may be set. The via-spot is set, for example, by the designation of a room through which the user wants to pass. Then, in S5 (FIG. 3), an edge that passes through cells holding the identification information of the designated room is specified using the route search image, and a route containing the edge is extracted.

However, in the above-described route search according to the embodiment, a route that passes through an identical node multiple times is not extracted. Therefore, it is not possible to extract, for example, a route that goes through a room having only one gateway and goes toward another destination. Hence, in the case where a room having only one gateway is designated as a via-spot in the route search process of S5 (FIG. 3), a route that goes to the designated via-spot and returns through an identical node is exceptionally generated.

Figure 38:
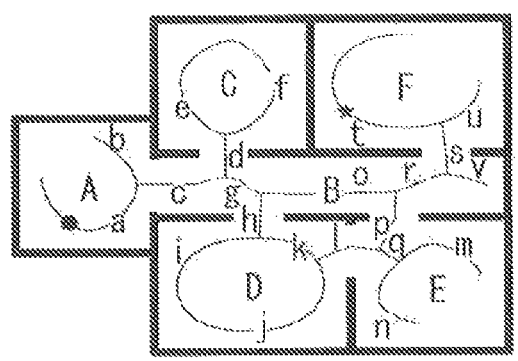
FIG. 38 is a diagram for describing the search of a route that passes through a via-spot.

FIG. 38 is a diagram for describing the search of a route that passes through a via-spot. In the example of FIG. 38, five rooms "A", "C", "D", "E" and "F" are mutually connected through a passageway "B". Further, the rooms "D" and "F" are directly connected. The room "A" contains an edge a and an edge b that diverge, and is connected with the passageway "B" through an edge c. The room "C" contains an edge e and an edge f that form a loop, and is connected with the passageway "B" through an edge d. The room "D" contains an edge i, an edge j an edge k that form a loop, is connected with the passageway "B" through an edge h, and is connected with the room "F" through an edge l. The room "E" contains an edge t and an edge u that diverge, and is connected with the passageway "B" through an edge s. The room "F" contains an edge q, an edge m and an edge n that diverge, and is connected with the passageway "B" through an edge p. The passageway "B" contains an edge g, an edge o, an edge r and an edge v. Here, in the floor plan of FIG. 38, the starting point (circle mark) is set on the edge a in the room "A", and the ending point (star mark) is set on the edge t in the room "E". Further, as the via-spot, the room "C" and the room "D" are set.

When the search of the route is performed under such a condition, routes (1) to (3) indicated by the following three edge arrays are found.

(1) Edges a, c, g, o, r, s, t (the number of edges is 7)
(2) Edges a, c, g, h, k, l, p, r, s, t (the number of edges is 10)
(3) Edges a, c, g, h, i, j, l, p, r, s, t (the number of edges is 11)

Here, the above routes (2) and (3) pass through the edge i, edge j and edge k contained in the room "D".

Figure 39A:
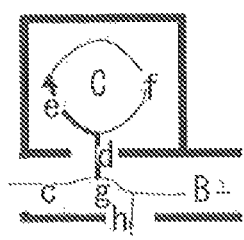
FIG. 39A is a diagram illustrating an example of a route found by the search from a room that is the via-spot.
Figure 39B:
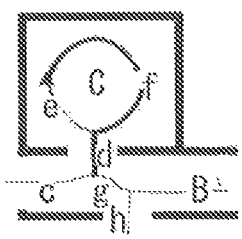
FIG. 39B is a diagram illustrating an example of another route found by the search from the room that is the via-spot.

On the other hand, in the room "C", only the gateway is the edge d, and a route that passes through the edge e or edge f contained in the room "C" is not extracted. Hence, the route search is performed from an arbitrary point on the edges in the room "C" through which the route cannot pass, to a node on the above route (2) or (3). Here, the description is made using the route (3). When the route is searched under such a condition, routes illustrated in FIG. 39A and FIG. 39B are found. Here, the triangle mark in the figures indicates a via-spot. That is, routes (4) and (5) indicated by the following two edge arrays are found.

(4) Edges e, d (the number of edges is 2)
(5) Edges e, f, d (the number of edges is 3)

Next, the above route (3) is divided at a node of the intersection point between the routes (4) and (5) found by the search from the room "C" of the via-spot and the above route (3). For example, the above route (3) is divided into the following two edge arrays (3-1) and (3-2).

(3-1) Edges a, c (the number of edges is 2)
(3-2) Edges g, h, i, j, l, p, r, s, t (the number of edges is 9)

Figure 40:
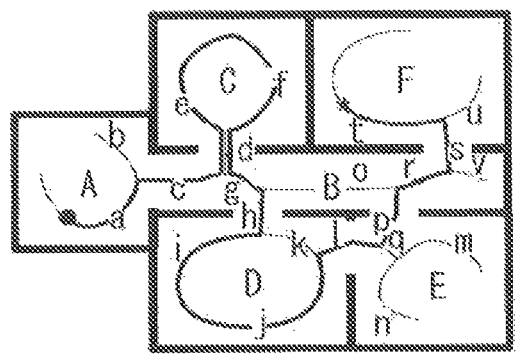
FIG. 40 is a diagram illustrating an example of the route that passes through the via-spot.

Then, the edge arrays (4) and (5) for going through the room "C" are inserted between the divided edge arrays. Here, in the case where a plurality of routes are found as the route from "C" that is the via-spot, edge arrays that constitute two arbitrary routes are inserted, and in the case where only one route is found as the route from the room "C", edge arrays that go and return on the route are inserted. For example, the above routes (4) and (5) are inserted between the edge arrays (3-1) and (3-2), and a route (6) illustrated in FIG. 40 is generated. The route (6) is expressed by an edge array as follows. In this way, the route passes through the edge d and the edge e twice, and thereby, it is possible to generate the route that passes through the dead-end room "C".

(6) Edges a, c, d, e, e, f, d, g, h, i, j, l, p, r, s, t (the number of edges is 16)

Here, instead of designating the room as the via-spot, a point on the floor plan may be designated similarly to the departure spot and the arrival spot. In this case, for example, a first route from the departure spot to the via-spot and a second route from the via-spot to the arrival spot may be searched. By connecting the first route and the second route, a route that passes through the via-spot is generated. On this occasion, a smooth route can be generated, when the first and second routes are selected such that the direction at the ending point of the first route (a vector from a point just before the ending point on the route toward the ending point) and the direction at the starting point of the second route (a vector from the starting point toward a slightly advanced point on the route) are identical or similar directions.

<Creation of Smoother Route>

Figure 41:
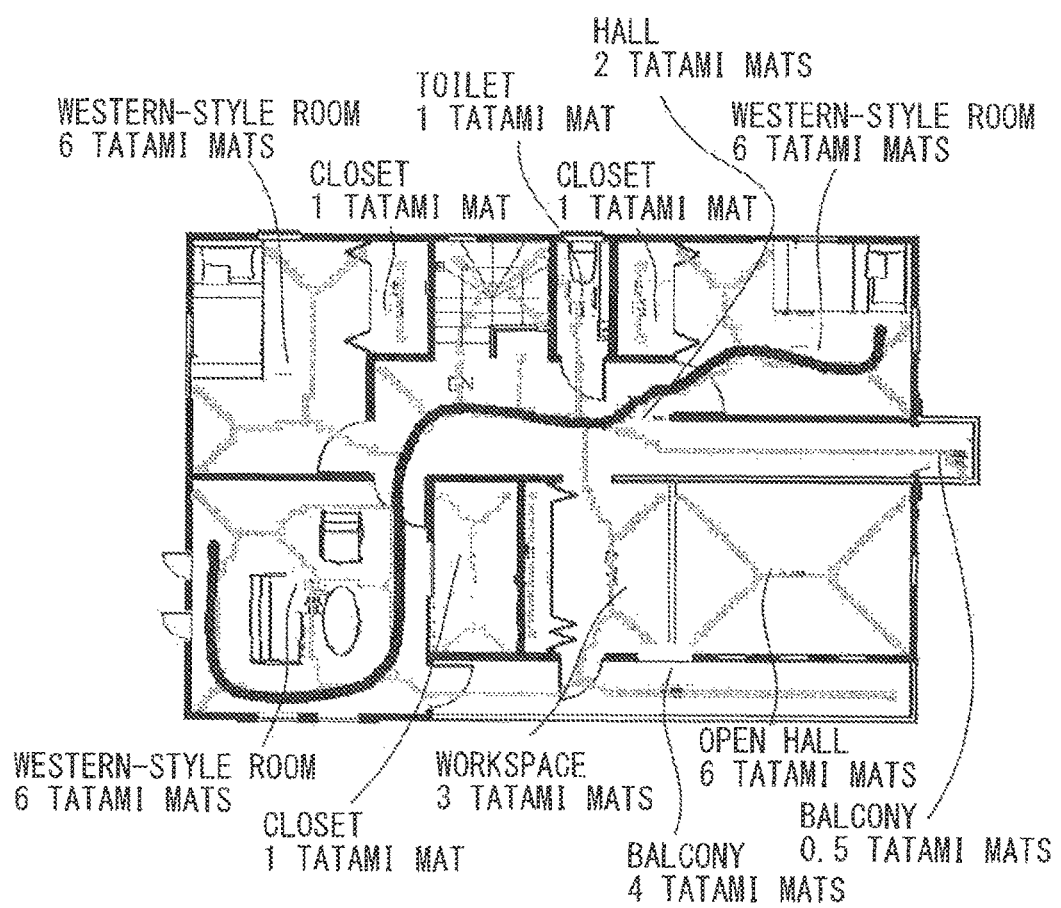
FIG. 41 is a diagram illustrating an example of the route according to an embodiment.

FIG. 41 is a diagram illustrating an example of the route evaluated by the above-described route search according to the embodiment. The route to be generated by the process in the embodiment is suitable for evaluating the route for walking while avoiding obstacles such as furniture. However, a wobbling route candidate is sometimes generated in a room where furniture and the like are not placed. Further, according to the process indicated in the modification of the noise removal, radial route candidates extending from the center of the room toward the corners of the room are generated, and therefore, a route candidate that returns to the center of the room once is sometimes obtained.

Hence, in the modification, when a path is approximated by a polygonal line in S41 to S43 (FIG. 25) of the smoothing process, a polygonal line connected by straight lines without changing the direction as much as possible is generated. Specifically, first, the smoothing unit 107 initially joins both ends of a path by a straight line, and judges whether there is no impassable spot between them. Then, in the case where there is no impassable spot on the route, the path is not approximated by a polygonal line, and is joined by the straight line with no change. Further, in the case where there is an impassable spot, a node that is as far from the starting point of the path as possible and for which the straight line joined with the starting point does not collides with the impassable spot is extracted, and the starting point and the extracted node are joined by the straight line. Thereafter, the same process is repeated for the interval from the extracted node to the ending point. For example, whether there is an impassable spot in the intervals from the starting point to the second node from the ending point, the third node from the ending point, . . . , and from the node following the starting point to the ending point is sequentially checked, and when there is no impassable spot between the nodes, the nodes are joined by a straight line. In this way, when the original route is approximated, a polygonal-line route that does not collide with the impassable spot is generated.

Figure 42:
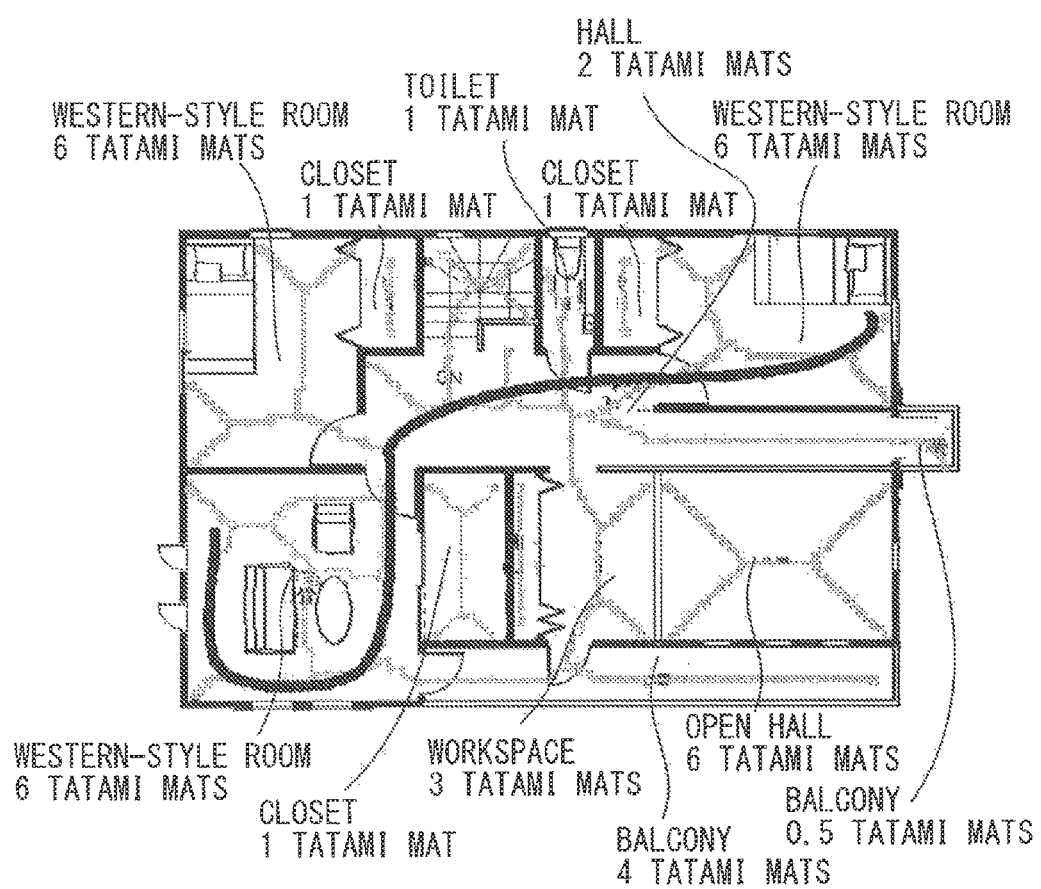
FIG. 42 is a diagram for describing a modification for smoothing the curve.

Thereafter, the curve transformation after s44 (FIG. 25) is performed, and thereby, it is possible to decrease the unnecessary wobbling. FIG. 42 is a diagram illustrating an example of the route in the case of using the polygonal line generated in the modification. The starting point and the ending point are the same as those on the route illustrated in FIG. 41. Further, the route in a lower left room, in which the movement is performed while furniture and the like are avoided, is roughly the same as the route in FIG. 41. However, in a passageway and an upper right room, in which there is no obstacle on the route, a smoother route is generated.

<Display of Walk-Through>

As illustrated in S7 of FIG. 3, the walk-through display unit 108 performs the display of the walk-through that moves in the three-dimensional model, based on the smoothed route on the floor plan. Here, as the route that is used for the display, one of a plurality of routes found by the search may be designated by the user, or a route having the shortest distance may be employed. Here, in the case where the plurality of routes found by the search are presented to the user, for example, it is allowed to present the routes on the floor plan one by one as illustrated in FIG. 29 and to enable the user to select the route that is used for the display of the walk-through.

In the display of the walk-through, the movement in a building is performed with the viewpoint of the user, and therefore, the sight line direction of the camera is oriented to a point on the route that is a predetermined distance (for example, 100 cm) away, so that a natural movement can be expressed. Further, in the case of coming close to a fitting such as a door or stairs, it is possible to express a natural movement including the fixation of the sight line in the moving direction to the fitting such as the door or the stairs instead of the point on the route that is the predetermined distance away and the temporary stop in front of the door or the stairs and the pass-through after the opening of the door.

As the method for determining the routes that are presented to the user and the method for determining the order in which the routes are presented to the user, routes that are short in the distance from the starting point to the ending point may be preferentially presented, routes that pass through pathways having wide widths may be preferentially presented, or routes in which the number of pass-through doors is small may be preferentially presented. Further, the routes that are presented to the user may be determined by the combination of the conditions.

In the case of preferentially presenting the routes that pass through pathways having wide widths, the weighting of the edge is performed depending on the distance from the outer edge of the passable region, using the map that is generated in S12 described with use of FIG. 9, for example. In the weighting of the edge, it is allowed to use the average value, maximum value, minimum value or the like of the weights of the cells on the map that overlap with the edge. Then, when the distance from the starting point to the ending point is calculated, the distance is multiplied by a value depending on the weight, and thereby, routes that are wide in width and are easy to pass even though the distance is long are preferentially presented.

In the case of preferentially presenting the routes in which the number of pass-through doors is small, the weighting is performed such that routes that pass through the cells indicating the doors on the route search image illustrated in FIG. 7 have low priorities, for example. Thereby, in the case where routes having similar distances are found, routes in which the number of pass-through doors is small are preferentially presented.

<Others>

The present disclosure includes a computer program for executing the above-described process. Moreover, a computer-readable recording medium in which the program is recorded is also included in the category of the present disclosure. As for the recording medium in which the program is recorded, the computer reads and executes the program in the recording medium, allowing for the above-described process.

Here, the computer-readable recording medium is a recording medium that can accumulate information such as data and programs by electric, magnetic, optical, mechanical or chemical action and that can be read by the computer. Among such recording media, as recording media that can be removed from the computer, there are a flexible disk, a magneto-optical disk, an optical disk, a magnetic tape, a memory card and the like. Further, as recording media that are fixed in the computer, there are a hard-disk drive, a ROM and the like.

DESCRIPTION OF THE REFERENCE NUMERALS AND SYMBOLS 1 route generation apparatus
101 storage unit
102 floor plan reading unit
103 cell division unit
104 thinning unit
105 graph generation unit
106 route search unit
107 smoothing unit
108 walk-through display unit

The invention claimed is:

1. A route generation method in which a computer executes:
   generating cells, by a CPU of the computer, based on data about a floor plan, stored in a storage of the computer, that includes information indicating a type of a constituent element of a house and setting, by the CPU, the information indicating the type of the constituent element in each of the cells, the cells being formed by separating a plane in a grid pattern having a predetermined size;
   reading, by the CPU, the information indicating the type of the constituent element set in the cell stored in the storage, specifying, by the CPU, an outer edge of a passable region based on whether the constituent element is passable determined in advance in association with the type of the constituent element, and generating, by the CPU, data about a pathway in which the passable region is thinned, by extracting cells that are at long distances from the outer edge of the passable region compared to the peripheral cells;
   generating, by the CPU, a graph based on the data about the pathway, the graph including nodes indicating an endpoint or an intersection point on the pathway and an edge connecting the nodes;
   setting, by the CPU, a starting point and an ending point, based on an input from a user, and searching a path from the starting point to the ending point, using the graph; and
   generating, by the CPU, a walk-through simulator that displays, from the viewpoint of the user, a walk-through in a three-dimensional model of the floor plan via a sight line direction of a camera pointing in the direction of the path from the starting point to the ending point.

2. The route generation method according to claim 1, wherein the computer further executes:
   generating, by the CPU, a movement route, based on the path, by transforming the path into a curve;
   reading, by the CPU, the information indicating the type of the constituent element, for the movement route, and judging, by the CPU, whether the movement route and an impassable constituent element collide, based on whether the constituent element is passable, the information indicating the type of the constituent element being set in the cell through which the movement route passes, whether the constituent element is passable being determined in advance in association with the type of the constituent element; and
   changing, by the CPU, a curvature at a point on the movement route, in response to determining that the movement route and the impassable constituent element.

3. The route generation method according to claim 2, wherein
   the data about the floor plan includes a constituent element the type of which is a door or stairs, and
   a polygonal line by which the path is approximated is generated by adopting, as an apex, at least a node present at a position corresponding to a cell for the constituent element the type of which is the door or the stairs, and the movement route is generated based on the apex of the polygonal line.

4. The route generation method according to claim 2, wherein
   a via-point is further set based on an input from the user, a second path is further searched in response to determining that each obtained first path does not pass through the via-point, and the path from the starting point to the ending point is generated by linking the first path and the second path, the first path being a path from the starting point to the ending point, the second path being a path from the via-point to a node contained included in the first path.

5. The route generation method according to claim 2, wherein
   the CPU further executes drawing a three-dimensional model of a building indicated by the data about the floor plan, and orienting a sight line to a point on the movement route a predetermined distance away while moving a viewpoint along the movement route in the three-dimensional model.

6. The route generation method according to claim 1, wherein
   in response to determining that there is a node array that is looped in a predetermined distance or less, the route is searched, by the CPU, while the node array is replaced with a single virtual node.

7. The route generation method according to claim 1, wherein
   the data about the floor plan includes data about furniture that is an impassable constituent element, as the constituent element.

8. A non-transitory computer readable medium storing a route generation program that causes a computer comprising a CPU to execute:
   generating cells based on data about a floor plan, stored in a storage of the computer, that includes information indicating a type of a constituent element of a house and setting the information indicating the type of the constituent element in each of the cells, the cells being formed by separating a plane in a grid pattern having a predetermined size;

reading the information indicating the type of the constituent element set in the cell stored in the storage, specifying an outer edge of a passable region based on whether the constituent element is passable determined in advance in association with the type of the constituent element, and generating data about a pathway in which the passable region is thinned, by extracting cells that are at long distances from the outer edge of the passable region compared to the peripheral cells;

generating a graph based on the data about the pathway, the graph including nodes indicating an endpoint or an intersection point on the pathway and an edge connecting the nodes;

setting a starting point and an ending point, based on an input from a user, and searching a path from the starting point to the ending point, using the graph; and generating a walk-through simulator that displays, from the viewpoint of the user, a walk-through in a three-dimensional model of the floor plan via a sight line direction of a camera pointing in the direction of the path from the starting point to the ending point.

9. A route generation apparatus comprising a CPU configured to:

generate cells based on data about a floor plan, stored in a storage of the route generation apparatus, that includes information indicating a type of a constituent element of a house and to set the information indicating the type of the constituent element in each of the cells, the cells being formed by separating a plane in a grid pattern having a predetermined size;

read the information indicating the type of the constituent element set in the cell stored in the storage, to specify an outer edge of a passable region based on whether the constituent element is passable determined in advance in association with the type of the constituent element, and to generate data about a pathway in which the passable region is thinned by extracting cells that are at long distances from the outer edge of the passable region compared to the peripheral cells;

generate a graph based on the data about the generated pathway, the graph including nodes indicating an endpoint or an intersection point on the pathway and an edge connecting the nodes;

set a starting point and an ending point, based on an input from a user, and to search a path from the starting point to the ending point, using the generated graph; and generate a walk-through simulator that displays, from the viewpoint of the user, a walk-through in a three-dimensional model of the floor plan via a sight line direction of a camera pointing in the direction of the path from the starting point to the ending point.

* * * * *